US012148467B2

(12) United States Patent
Fantini et al.

(10) Patent No.: US 12,148,467 B2
(45) Date of Patent: *Nov. 19, 2024

(54) DECODING FOR A MEMORY DEVICE

(71) Applicant: Micron Technology, Inc., Boise, ID (US)

(72) Inventors: Paolo Fantini, Vimercate (IT); Lorenzo Fratin, Buccinasco (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

This patent is subject to a terminal disclaimer.

(21) Appl. No.: 17/885,136

(22) Filed: Aug. 10, 2022

(65) Prior Publication Data
US 2023/0032006 A1 Feb. 2, 2023

Related U.S. Application Data

(63) Continuation of application No. 17/117,953, filed on Dec. 10, 2020, now Pat. No. 11,423,981.

(51) Int. Cl.
*G11C 13/00* (2006.01)
*H10B 63/00* (2023.01)
*H10N 70/00* (2023.01)

(52) U.S. Cl.
CPC ........ *G11C 13/0023* (2013.01); *G11C 13/003* (2013.01); *H10B 63/84* (2023.02); *H10N 70/011* (2023.02); *H10N 70/882* (2023.02)

(58) Field of Classification Search
CPC .............. G11C 13/0023; G11C 13/003; G11C 13/0004; G11C 13/0028; G11C 13/0026;
(Continued)

(56) References Cited

U.S. PATENT DOCUMENTS 6,522,592 B2 * 2/2003 Van De Graaff ... G11C 11/4091
365/207
10,658,033 B2 5/2020 Nazarian et al.
(Continued)

FOREIGN PATENT DOCUMENTS

KR 10-2000-0043180 A 7/2000

OTHER PUBLICATIONS

"International Search Report and Written Opinion of the International Searching Authority," issued in connection with Int'l Appl. No. PCT/US21/72696, dated Apr. 5, 2022 (10 pages).

(Continued)

*Primary Examiner* — Mohammed A Bashar
(74) *Attorney, Agent, or Firm* — Holland & Hart LLP

(57) ABSTRACT

Methods, systems, and devices for decoding for a memory device are described. A decoder may include a first vertical n-type transistor and a second vertical n-type transistor that extends in a third direction relative to a die of a memory array. The first vertical n-type transistor may be configured to selectively couple an access line with a source node and the second n-type transistor may be configured to selectively couple the access line with a ground node. To activate the access line coupled with the first and second vertical n-type transistors, the first vertical n-type transistor may be activated, the second vertical n-type transistor may be deactivated, and the source node coupled with the first vertical n-type transistor may have a voltage applied that differs from a ground voltage.

20 Claims, 12 Drawing Sheets

(58) Field of Classification Search
CPC .... H10B 63/84; H10B 63/845; H10N 70/011; H10N 70/882; H10N 70/066; H10N 70/20; H10N 70/823
See application file for complete search history.

(56) References Cited

U.S. PATENT DOCUMENTS

| | | |
|---|---|---|
| 10,672,432 B2 | 6/2020 | Beigel et al. |
| 2008/0123415 A1 | 5/2008 | Frulio et al. |
| 2010/0270529 A1 | 10/2010 | Lung |
| 2020/0176039 A1 | 6/2020 | Redaelli et al. |
| 2020/0294583 A1 | 9/2020 | Miyazaki |
| 2020/0411114 A1* | 12/2020 | Sakakibara ......... G11C 11/5628 |
| 2021/0295892 A1 | 9/2021 | Miyazaki |

OTHER PUBLICATIONS

Outgoing—ISA/210—International Search Report Mailed on Apr. 5, 2022 for WO Application No. PCT/US21/072696.

Taiwanese Patent Office, "Office Action and Search Report", issued in connection with Taiwanese Patent Application No. 110143540 dated Aug. 3, 2022 (23 pages).

Chinese patent office, "China Office Action," issued in connection with China Patent Application No. 202180082319.1 dated Apr. 5, 2024 (7 pages) (2 pages of English Translation and 5 pages of Original Document).

* cited by examiner

DECODING FOR A MEMORY DEVICE

CROSS REFERENCE

The present Application for Patent is a continuation of U.S. patent application Ser. No. 17/117,953 by Fantini et al., entitled "DECODING FOR A MEMORY DEVICE," filed Dec. 10, 2020, assigned to the assignee hereof, and is expressly incorporated by reference in its entirety herein.

FIELD OF TECHNOLOGY

The following relates generally to one or more systems for memory and more specifically to decoding for a memory device.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

In some examples, scaling down the size of memory cells in a memory array may have one or more advantages for a memory device. For example, by scaling down the size of the memory cells, the overall size of the memory array may also be reduced. However, one or more layers of the memory device may not scale with the size of the memory cells. For example, a complementary metal-oxide-semiconductor (CMOS) under array (CuA) layer may include one or more components that may not be efficiently scaled down or sized similarly as the memory array. The CuA layer may include a decoder that is configured to bias one or more access lines (e.g., digit lines, word lines) coupled with memory cells of the memory array. As such, the amount by which memory cells are scaled may be limited by a size of the decoder or other components that support the memory array.

Systems, devices, and techniques are described for positioning a stage of the decoder between the memory array of the CuA. Additionally or alternatively, the stage of the decoder may include a first vertical n-type transistor and a second vertical n-type transistor that extends in a third direction relative to a die of the memory array, where the first vertical n-type transistor is configured to selectively couple an access line to a source node and the second n-type transistor is configured to couple the access line with a ground node. Such a configuration may enable the size of the die area used for the decoder to become smaller as the memory array is scaled down. By extending the first and second vertical n-type transistors in the third direction, the memory cells may be scaled down more while retaining sufficient space for the decoder.

Features of the disclosure are initially described in the context of memory arrays, a block diagram, decoders, and a circuit as described with reference to FIGS. 1-5. These and other features of the disclosure are further illustrated by and described with reference to an apparatus diagram and flowcharts that relate to decoding for a memory device as described with references to FIGS. 6-8.

Figure 1:
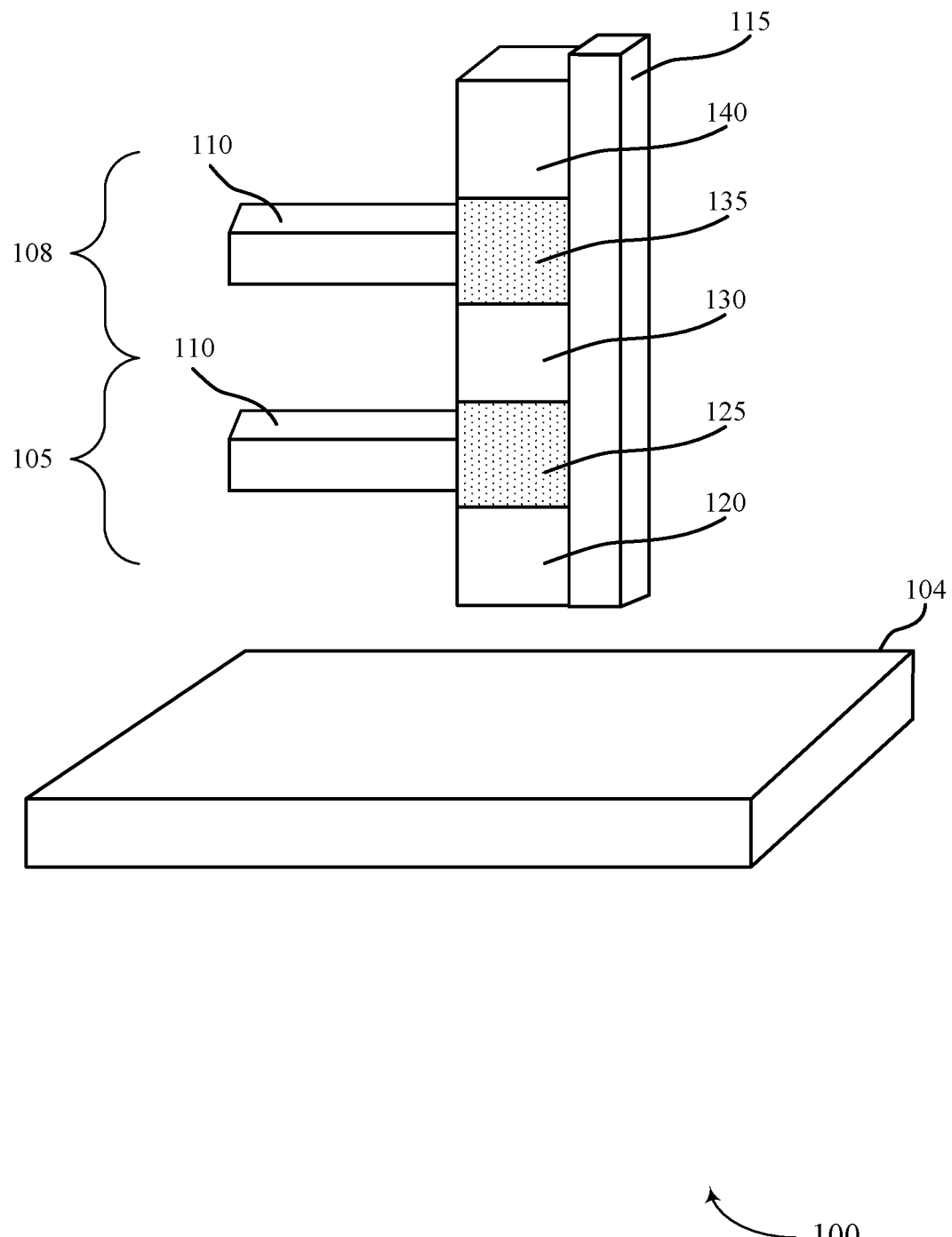
FIG. 1 illustrates an example of a memory array that supports decoding for a memory device in accordance with examples as disclosed herein.

FIG. 1 illustrates an example of a memory array 100 (e.g., a three-dimensional (3D) memory array) that supports a memory device with a split pillar architecture in accordance with examples as disclosed herein. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Some portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism is not limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include an additional substrate 104 (e.g., positioned above the two decks 105 and 108. The additional substrate 104 may have a plurality of contacts (e.g., extending through the substrate) and coupled with an access line of the memory array 100.

The memory array 100 may include a plurality of planes of a conductive material separated by one another by a second insulative material formed on the first insulative material on the substrate material. Each of the plurality of planes of the conductive material may include a plurality of recesses formed therein. The plurality of planes, for example, word line plates corresponding to one or more word lines 110 on a same deck (e.g., memory deck 105, memory deck 108), may be obtained by a replacement process by using a sacrificial layer (e.g., a conformal layer) for etching during a stack deposition processing step, removing the conformal layer after cell definition and replacing the conformal layer with a more conductive material.

An insulative material may be formed in a serpentine shape through the second insulative material and the conductive material. A plurality of conductive pillars may be formed in openings to extend substantially perpendicular to the plurality of planes of the conductive material and the substrate. The plurality of conductive pillars may be divided into a plurality of pillar pairs. Each pillar in the pair of pillars may be coupled to a different one of the conductive contacts. In some cases, each pillar in the pair of pillars may be coupled to a conductive contact on substrate 104. Additionally or alternatively, one pillar of each pair of pillars may be coupled to a conductive contact on the substrate 104 and the other pillar of each pair of pillars may be coupled to a conductive contact on a different substrate 104 (e.g., positioned above the memory decks 105 and 108).

In some examples, the memory decks 105 and 108 may include chalcogenide material configured to store logic states. For example, the memory cells of the memory decks 105 and 108 may be examples of self-selecting memory cells. A chalcogenide material may be formed in the plurality of recesses such that the chalcogenide material in each respective one of the plurality of recesses is at least partially in contact with one pillar of the plurality of pairs of pillars.

In some examples, scaling down the size of memory cells in a memory array 100 may have one or more advantages. For instance, by scaling down the size of the memory cells, the memory array 100 may hold more memory cells and may thus store more data. However, as the memory cells are scaled down, there may be less space around a given memory cell for placing a decoder (e.g., a decoder coupled with the substrate 104) that is configured to bias one or more access lines (e.g., digit lines 115, word lines 110) coupled with the memory cell. As such, the amount by which memory cells are scaled may be limited by a size of the decoder.

In some examples, the memory array 100 may be coupled with a CuA layer (not shown). In some cases, the CuA layer may be positioned below the substrate 104 or may include the substrate 104. The CuA layer may include a decoder that is configured to bias one or more access lines (e.g., digit lines 115 or word lines 110) coupled with memory cells of the memory array 100. To enable sufficient space for the decoder as the memory cells are scaled down, the decoder may include a first vertical n-type transistor and a second vertical n-type transistor that extends in a third direction relative to a die of the memory array 100, where the first vertical n-type transistor is configured to selectively bias an access line to a source voltage and the second n-type transistor is configured to selectively bias the access line to a ground voltage. By extending the first and second vertical n-type transistors in the third direction, the memory cells may be scaled down more while retaining sufficient space for the decoder.

Figure 2:
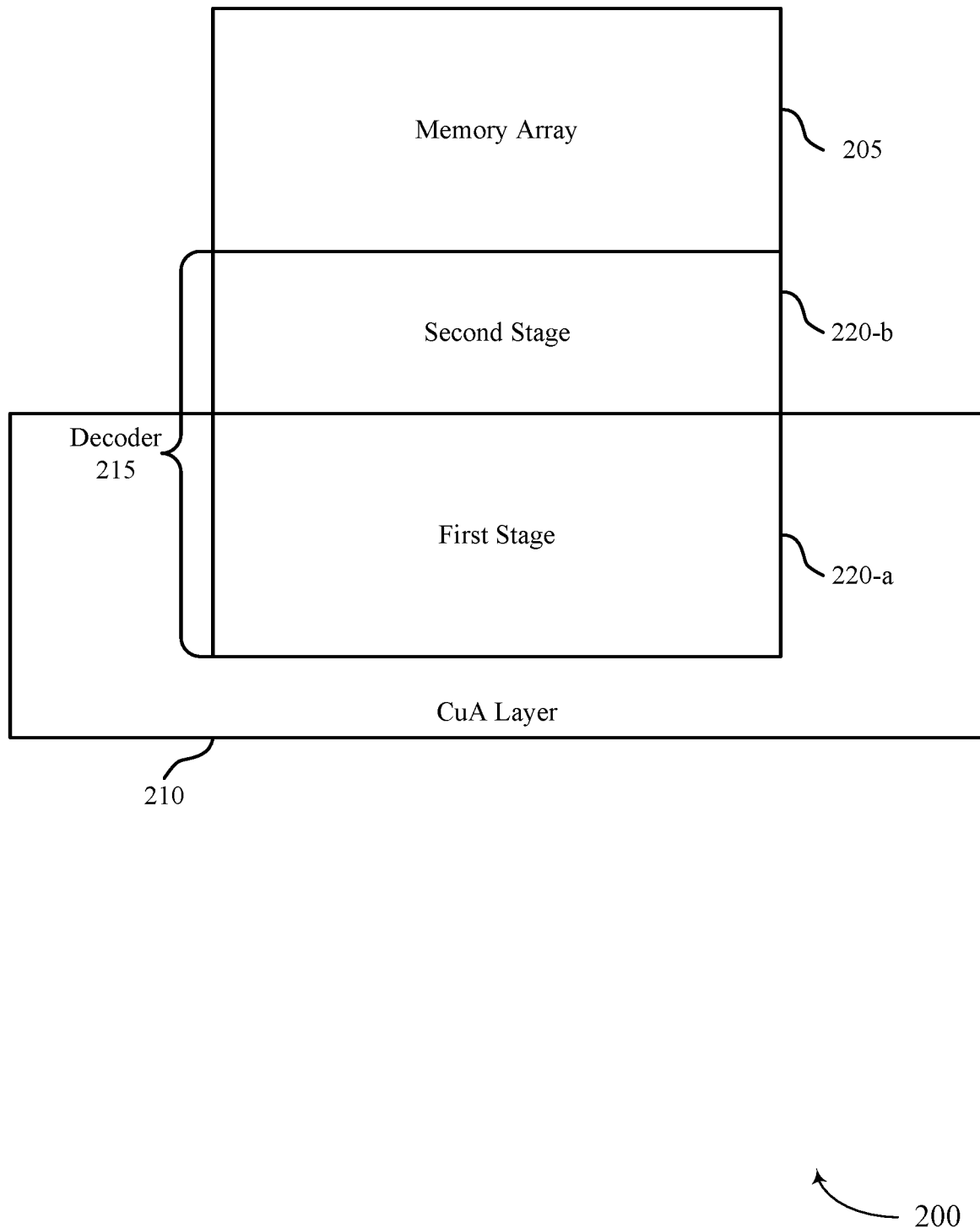
FIG. 2 illustrates an example of a block diagram that supports decoding for a memory device in accordance with examples as disclosed herein.

FIG. 2 illustrates an example of a block diagram 200 that supports decoding for a memory device in accordance with examples as disclosed herein. The block diagram 200 may include a memory array 205, which may be an example of a memory array 100 described with reference to FIG. 1. The block diagram 200 may also include a complementary metal-oxide-semiconductor (CMOS) under array (CuA) layer 210, and a decoder 215.

The memory array 205 may include memory cells. In some examples, the memory cells may be arranged in decks, and may each have one or more self-selecting memory cells. The memory cells may be programmed or accessed via access lines (e.g., word lines and digit lines). The access lines may be biased to one or more voltages to access the memory cells for programming or access operations.

The decoder 215 may be configured to bias the access lines of the memory array 205 as a part of access operations. The decoder 215 may include a first stage 220-a, which may include CMOS pre-decoding circuitry, and a second stage 220-b, which may include transistors (e.g., n-type transistors) configured to couple the access lines to one or more voltage sources. For example, a first voltage source may be a source node and a second voltage source may be a ground node. In some examples, the transistors may be vertical transistors. At least a portion of the decoder 215 may be included in the CuA layer 210. The CuA layer may be composed of silicon, and may include CMOS circuitry and interconnect components for operating the memory array 205.

In some examples, scaling down the size of memory cells in the memory array 205 may have one or more advantages. For example, by scaling down the size of the memory cells, the overall size of the memory array 205 may also be reduced. However, one or more components of the CuA layer 210 that may not be efficiently scaled down with the size of the memory array 205, such as n-type transistors or other components of the decoder 215 or the CuA layer 210. To enable sufficient space for the decoder 215 as the memory array 205 is scaled down, the second stage 220-*b* may be included in a layer between the memory array 205 and the CuA layer 210. In some examples, the layer may also include the CMOS pre-decoding circuitry of the first stage 220-*a*. In some examples, the second stage 220-*b* of the decoder 215 may include n-type transistors (e.g., n-type metal-oxide semiconductor (NMOS) transistors). For instance, the second stage 220-*b* transistor may include a first vertical n-type transistor and a second vertical n-type transistor, where each gate of each n-type transistor may be coupled with a respective gate line. The two n-type transistors may control which voltage source is coupled with an access line based on a whether the first n-type transistor or the second n-type transistor is activated. For example, a first gate voltage applied to the gate of the first n-type transistor may activate the first n-type transistor, which may couple a source node with the access line and bias the access line to a source voltage. Similarly, a second gate voltage applied to the gate of the second n-type transistor may activate the second n-type transistor, which may couple a ground node with the access line and bias the access line to a ground voltage.

FIGS. 3A through 3G illustrate various views of example memory arrays 300-*a*, 300-*b*, 300-*c*, 300-*d*, 300-*e*, 300-*f*, and 300-*g* during a series of steps or processes that may be performed to form a stacked memory device, in accordance with examples as disclosed herein. Specifically, FIGS. 3A through 3G may illustrate processes for forming memory cells in a memory array 205 that is to be coupled with the second stage 220-*b* of a decoder 215, each as described with reference to FIG. 2.

Figure 3A:
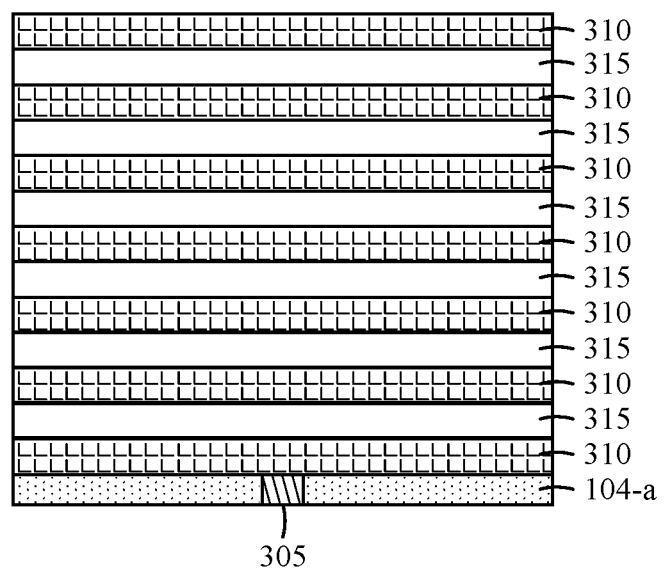
FIGS. 3A through 3G illustrate examples of memory arrays that support decoding for a memory device in accordance with examples as disclosed herein.
Figure 3B:
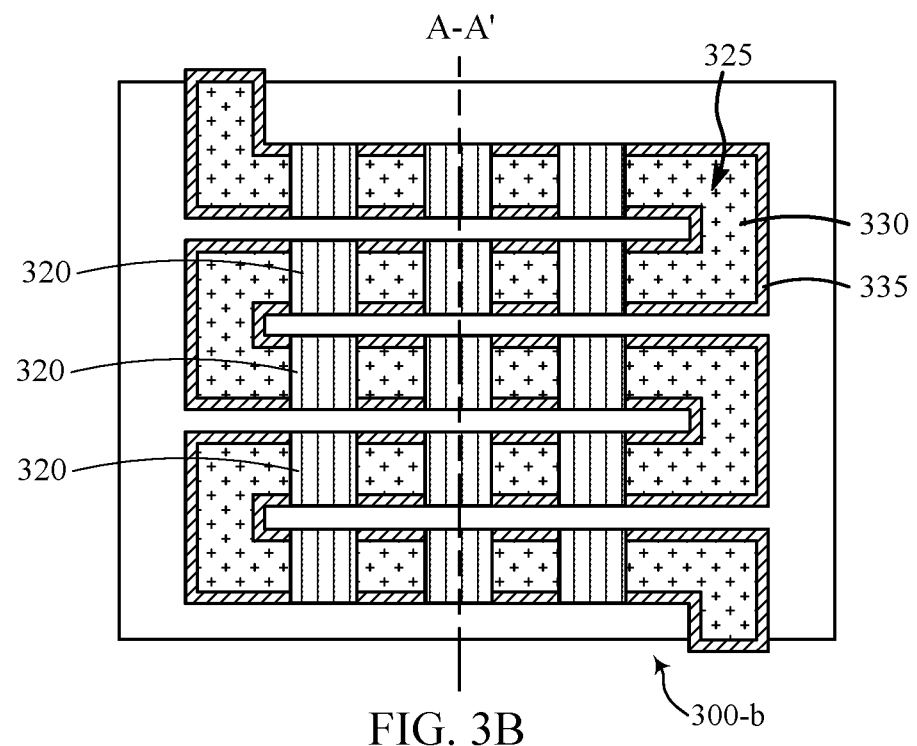
Figure 3C:
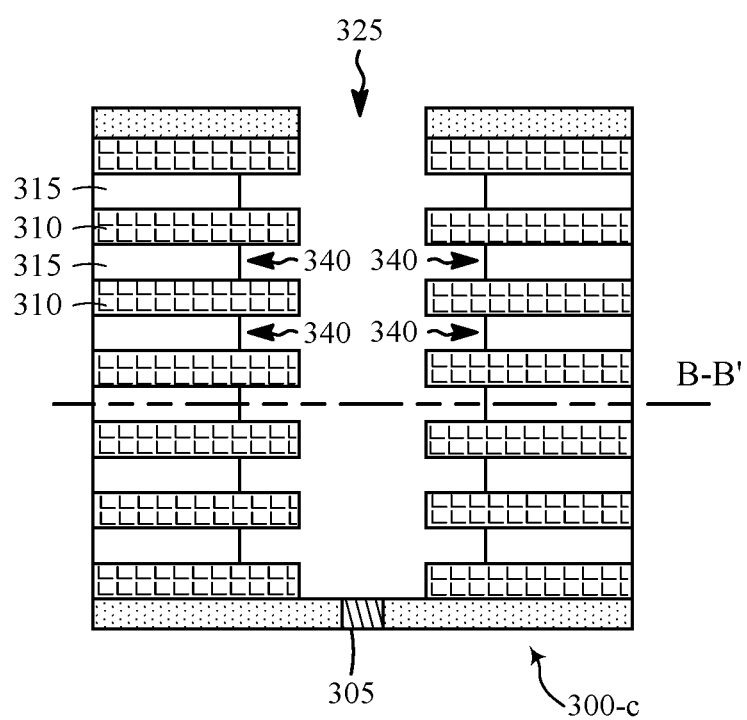
Figure 3D:
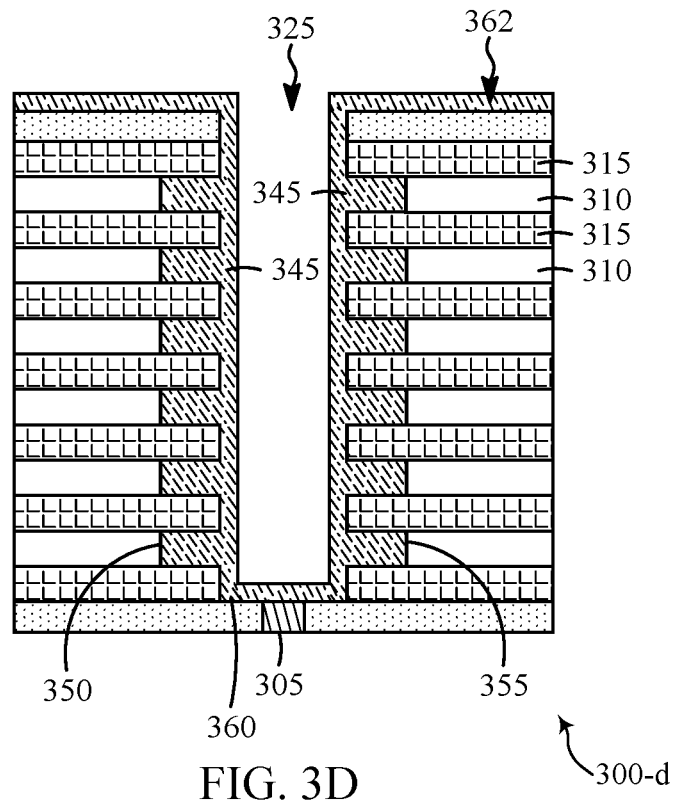
Figure 3E:
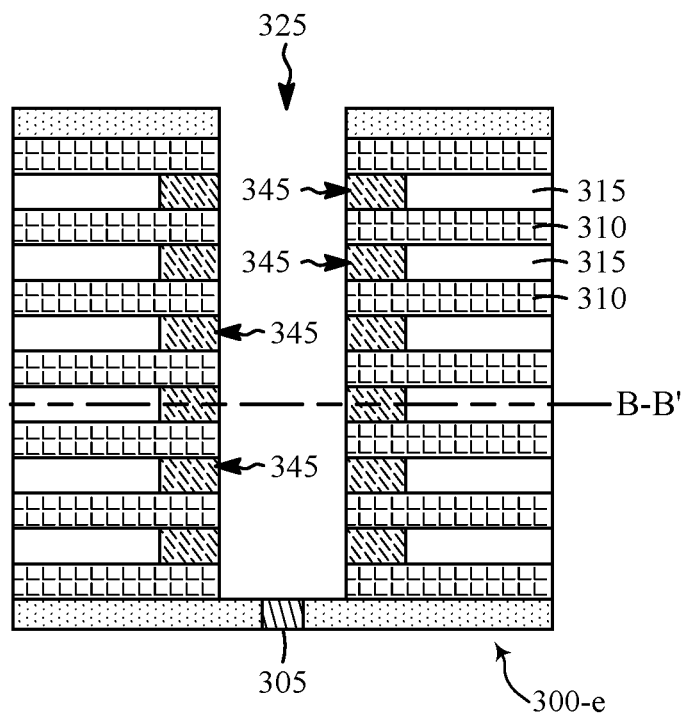
Figure 3F:
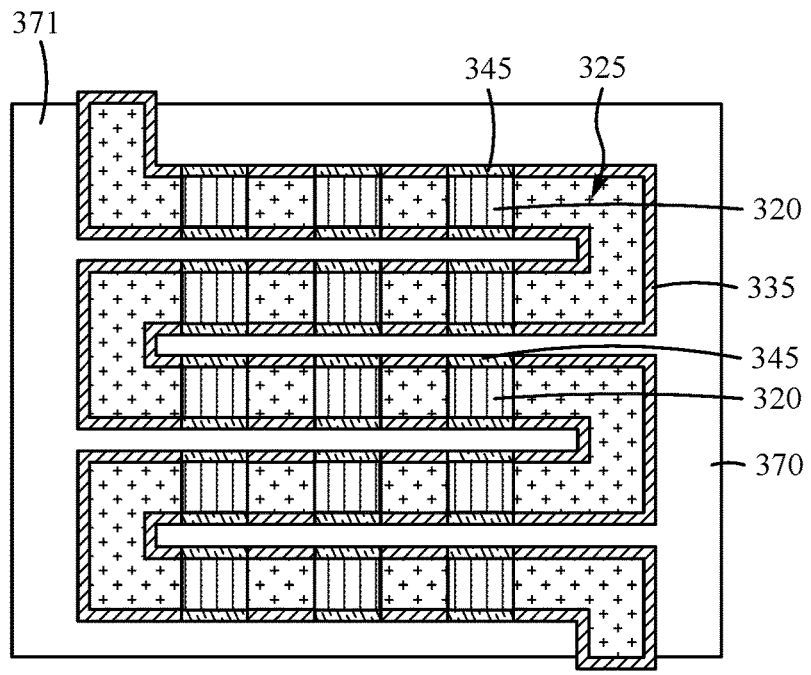
Figure 3G:
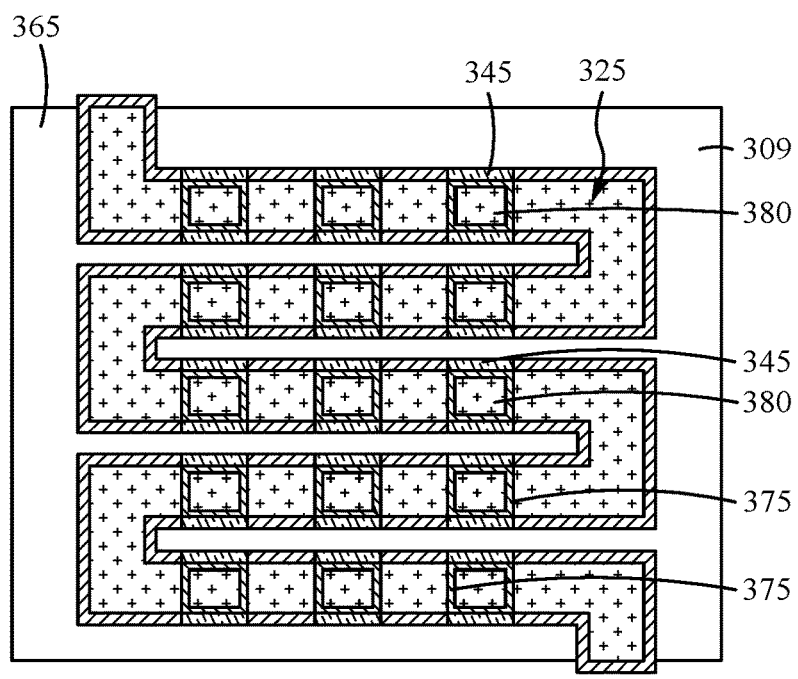

FIG. 3A illustrates a side view of an example memory array 300-*a* in accordance with examples as disclosed herein. FIG. 3B illustrates a top view of a memory array 300-*b*, which may be an example of the memory array with one or more formed openings 320, during a process step subsequent to what is illustrated in FIG. 3A. FIG. 3C illustrates a cross-sectional view of an example memory array 300-*c* along section line A-A' during a process step subsequent to what is illustrated in FIG. 3B. FIG. 3D illustrates a cross-sectional view of an example memory array 300-*d* along section line A-A' during a process step subsequent to what is illustrated in FIG. 3C. FIG. 3E illustrates a cross-sectional view of an example memory array 300-*e* along section line A-A' during a process step subsequent to what is illustrated in FIG. 3D. FIG. 3F illustrates a top view of the example memory array 300-*f* of section line B-B' during a process step subsequent to what is illustrated in FIG. 3E. FIG. 3G illustrates a top view of the example memory array 300-*g* of section line B-B' during a process step subsequent to what is illustrated in FIG. 3F.

The memory array 300-*a* of FIG. 3A may include a plurality of conductive contacts 305 formed in a substrate 104-*a*. The memory array 300-*a* may also include a plurality of stacked planes of an insulative material 310 and a plurality of stacked planes of a material 315 (e.g., word lines planes or word line plates). The stacked planes of material 315 may be separated in a z-direction (e.g., separated vertically) from one another by the plurality of planes of the insulative material 310. For example, a first plane (e.g., a bottom plane) of the second insulative material 310 may be formed (e.g., deposited) on the plane of the substrate 104-*a*, and then a plane of the material 315 may be formed on the first plane of the second insulative material 310. In some examples, a layer of the first insulative material 310 may be deposited on the substrate 104-*a*. In some examples, the material 315 may be a layer of conductive carbon or other conductive layer compatible with active materials. In some examples, the material 315 may include conductive layers separated by active material through a protective barrier. The material 315 may be configured to function as at least one word line plate. In some other examples, the material 315 may include a second insulative material (e.g., different than insulative material 310). In some examples, the material 315 and the insulative material 310 form a plurality of layers, such as alternating layers.

Additional planes of the second insulative material 310 may be formed on the material 315 in an alternating manner as illustrated in FIG. 3A. The second insulative material 310 may be a dielectric material, such as a dielectric film or layer. In some examples, the second insulative material 310 and the substrate 104-*a* may be the same type of insulative material. Examples of the insulative materials disclosed herein include, but are not limited to dielectric materials, such as silicon oxide.

Each respective one of the plurality of planes of the material 315 may be at (e.g., form) a different level of the memory array 300-*a*. Individual planes of material that form memory cells may be referred to as a deck of a 3D memory array. In some instances, the material 315 may be a conductive material. Here, the material 315 may comprise (e.g., be formed of) a metallic (or semi-metallic) material or a semiconductor material such as a doped polysilicon material, among others. In some examples, the material 315 may be a plane of conductive carbon. In some other instances, the material 315 may be a sacrificial insulative material. Here, the memory array 300-*c* may include a set of stacked planes of the sacrificial insulative material 315 and a set of stacked planes of the insulative material 310. The sacrificial insulative material 315 may be a different material than the insulative material 310 (e.g., an oxide material and a nitride material, respectively). During a process step subsequent to what is illustrated in FIG. 3A (e.g., FIGS. 3B and/or 3A), the sacrificial insulative material 315 may be removed and replaced by a conductive material (e.g., a layer of conductive carbon or other conductive layer compatible with active materials).

Six planes of the material 315 and seven planes of the second insulative material 310 are shown in FIG. 3A. The seventh plane of the second insulative material 310 may be a topmost layer of the memory array 300-*c*. The quantity of planes of the material 315 and the second insulative material 310 are not limited to the quantities illustrated in FIG. 3A. The material 315 and the second insulative material 310 may be arranged into more than six decks or less than six decks.

FIG. 3B illustrates a top view through any one of the planes of the material 315 of the memory array 300-*b*. A plurality of openings 320 in a trench 325 may be formed by etching away a portion of the dielectric material 330 and/or the conformal material 335. The openings 320 are intended to be positioned in alignment with the plurality of contacts 305 so that forming the openings 320 exposes at least a portion of a plurality of contacts 305 (shown in FIG. 3B) extending through the substrate 104-a (shown in FIG. 3A). The etching process may be a vertical etching process. In some examples, the etching operation may not etch away each portion of the conformal material 335, for example, where the plurality of openings 320 are not formed.

FIG. 3C illustrates a cross-sectional view of an example memory array 300-c in accordance with examples as disclosed herein. As shown in FIG. 3C, a plurality of recesses 340 may be formed in the material 315 in each of the planes. For example, a selective etching operation may be performed to form the plurality of recesses 340 in a full or partially isotropic way. The etching chemistry may be selected to selectively reach a material 315. The contacts 305 may be exposed by forming the openings 320 in in the trench 325.

FIG. 3D illustrates a cross-sectional view of an example memory array 300-d in accordance with examples as disclosed herein. As shown in FIG. 3D, a storage element material 345 may be formed in the plurality of recesses 340 by conformally depositing the storage element material 345 into the trench 325. The storage element material 345 may be deposited to contact sidewalls 350 and 355 and a bottom wall 360 of the trench 325 exposed by the etching of the conformal material 335. When the storage element material 345 contacts the bottom wall 360 of the trench 325, the storage element material 345 covers the exposed contacts 305.

The dimensions of the storage element material 345 may be based on the dimensions of other components of the memory array 300-d. For example, a height of the storage element material 345 may be controlled by depositing thicker or thinner layers of material 315 and/or the insulative material 310. In another example, a depth of the storage element material 345 may be controlled by etching longer or shorter recesses (e.g., recesses 340 as described with reference to FIG. 3C). By controlling the dimensions of other components of the memory array 300-e, the dimensions of the storage element material 345 may be controlled according to the desired dimensions of a memory cell associated with the memory array 300-e.

The storage element material 345 may be an example of a chalcogenide material, such as a chalcogenide alloy and/or glass, that may serve as a self-selecting storage element material (e.g., a material that may serve as both a select device and a storage element). For example, the storage element material 345 may be responsive to an applied voltage, such as a program pulse. For an applied voltage that is less than a threshold voltage, the storage element material 345 may remain in an electrically nonconductive state (e.g., an "off" state). Alternatively, responsive to an applied voltage that is greater than the threshold voltage, the storage element material 345 may enter an electrically conductive state (e.g., an "on" state).

FIG. 3E illustrates a cross-sectional view of an example memory array 300-f in accordance with examples as disclosed herein. An etching operation may be performed subsequent to forming the storage element material 345 so that surfaces of the storage element material 345 (e.g., the surfaces facing into the trench 325) is approximately coplanar with surfaces of the second insulative material 310 (e.g., the surfaces facing into the trench 325) as illustrated in FIG. 3E. The etching of the storage element material 345 may form a continuous sidewall and remove the top layer 362 (shown in FIG. 3D) of the storage element material 345, whereby cells of the storage element material 345 are formed in the recesses. In each recess, each cell of the storage element material 345 may contact a single material 315 (e.g., a single material 315 located adjacent to the cell of the storage element material 345) and at least two dielectric layers (e.g. a top dielectric layer and a bottom dielectric layer located on top of the cell of the storage element material 345 and on bottom of the cell of the storage element material 345), as shown in FIG. 3E. The etching of the storage element material 345 may provide a configuration in which the storage element material 345 are separated from one another. The etching of the storage element material 345 may also expose the contacts 305 in the substrate 104-a. In some examples, portion of sacrificial material may be located on either side of the cell of the storage element material 345 (as shown in FIG. 3F).

FIG. 3F illustrates a top view of an example memory array 300-f in accordance with examples as disclosed herein. As illustrated in FIG. 3F, the conformal material 335 and the storage element material 345 formed in the trench 325 may bifurcate each plane of the material 315 into a first portion 370 and a second portion 371. Each portion of a plane may be an example of a word line plate.

FIG. 3G illustrates a top view of an example memory array 300-g in accordance with examples as disclosed herein. As shown in FIG. 3G, a barrier material 375 is deposited into openings 320. In some implementations, the barrier material 375 contacts at least one portion of the first insulative material 310, the second insulative material 310, and the storage element material 345 as shown in FIG. 3E. In some examples, the barrier material 375 is compatible with an active material. The barrier material 375 may be a conductive material (e.g., a conformal concucive material), or a barrier layer with a conductive material. For example, the barrier material 375 may comprise aluminum oxide. In some examples, an etching operation may be performed to make room for conductive material to be deposited into the trench 325. In some cases, the barrier material 375 may be referred to as a barrier layer.

A material 380 may be deposited in the opening 320 to form a conductive pillar. Although FIG. 3G illustrates the material 380 as a dielectric material, the material 380 may be metallic (or semi-metallic) material or a semiconductor material such as a doped polysilicon material, among others. However, other metallic, semi-metallic, or semiconductor materials may be used. a metal material or a dielectric material. In some cases, the pillar may be partially filled by a metallic material and subsequently filled by a dielectric material. In some cases, the barrier material 375 may be a same material as the material 380. For example, the barrier material 375 and the material 380 may correspond to a conductive pillar including a uniform conductive material.

The conductive pillar may include the barrier material 375 and the material 380. In some examples, the conductive pillar may be formed in contact with the storage element material 345 on the sidewalls 350 and 355 (shown in FIG. 3D) of the trench 325. The conductive pillar may be a cylinder. Although FIG. 3G illustrates the conductive pillar as a solid pillar, in some examples the conductive pillar may be a hollow cylinder or toroidal (e.g., a tube). The conductive pillar formed in each respective one of the plurality of openings 320 are arranged to extend substantially orthogonal to the alternating planes of the material 315 and the second insulative material 310 as shown in FIG. 3E. The storage element material 345 and the conductive pillar formed in each respective one of the plurality of openings 320 are formed in a substantially square shape. Examples of the present disclosure are not limited to exact or quasi-exact square shapes. For instance, the storage element material 345 and the conductive pillar may be formed in any shape, including circles or oval shapes, for instance.

In some examples, more memory cells may be added by adding more contacts 305, creating more openings 320, and performing the methods as described with reference to FIGS. 3B through 3C. As the quantity of contacts 305 and/or openings 320 increase, the size of each decoder coupled with each contact 305 may also decrease. However, if the quantity of contacts 305 and/or openings 320 increase above a threshold amount, there may not be enough space to hold the decoder and/or other components of a CuA layer. To enable scaling down of the memory cells while mitigating this limitation, the decoder may be implemented as a first vertical n-type transistor and a second vertical n-type transistor. Additional details about the first vertical n-type transistor and the second vertical n-type transistor may be described with reference to FIGS. 4A-4D.

Figure 4A:
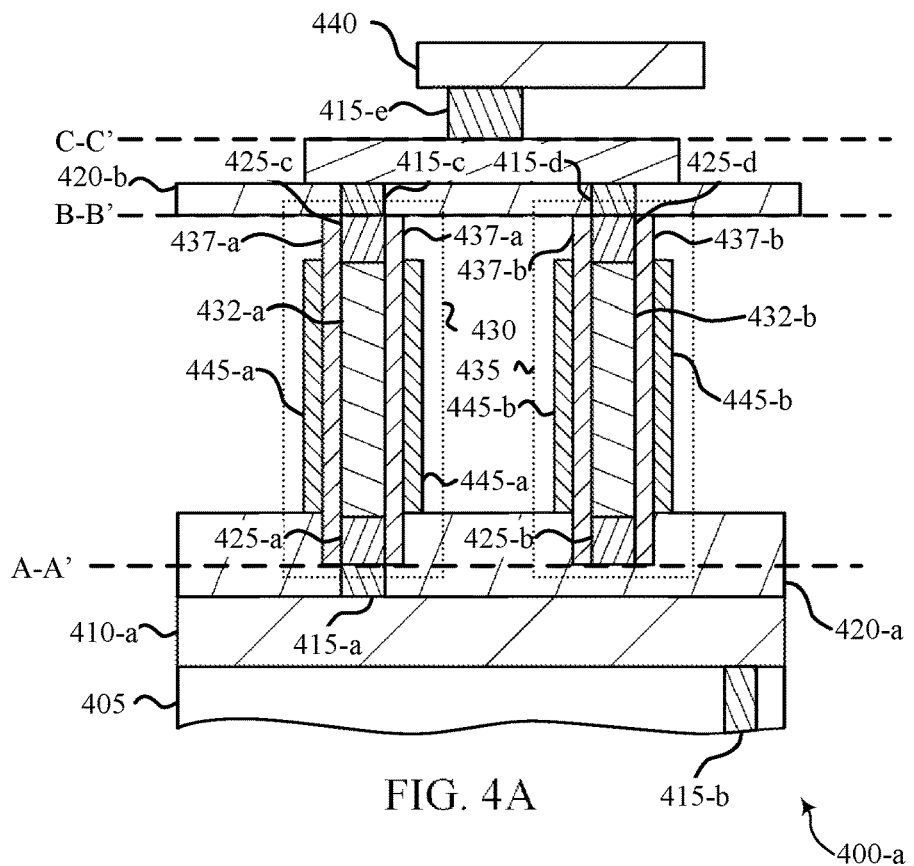
FIGS. 4A through 4D illustrate examples of a decoder that supports decoding for a memory device in accordance with examples as disclosed herein.
Figure 4B:
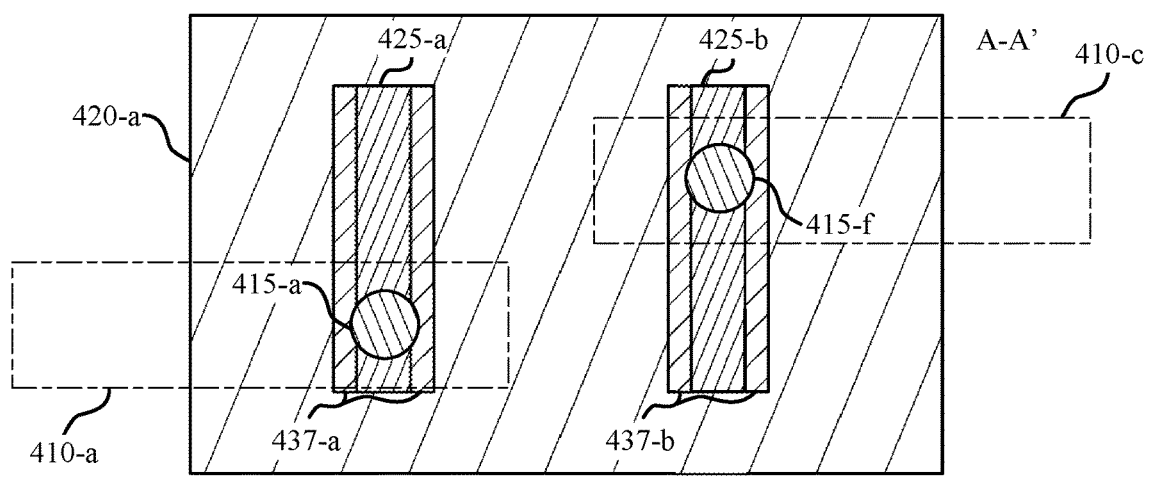
Figure 4C:
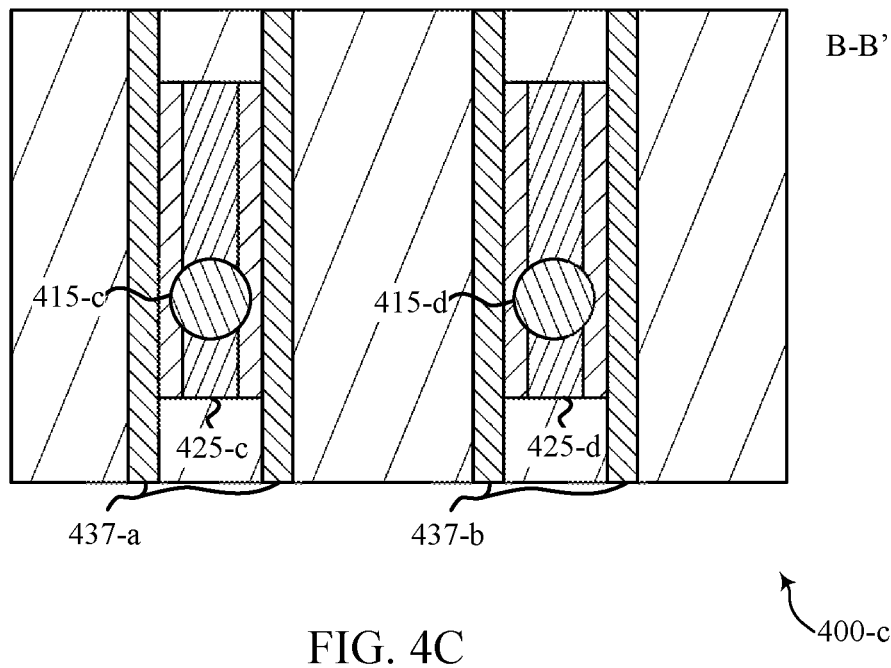
Figure 4D:
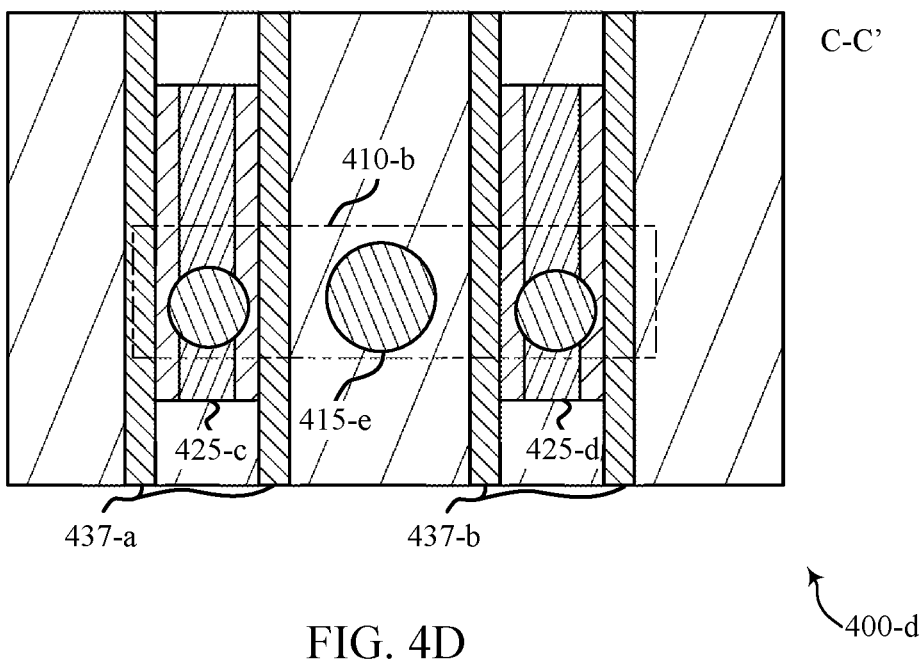

FIGS. 4A through 4C illustrate views of a decoder 400 that supports decoding for a memory device in accordance with examples as disclosed herein. In some examples, the decoder 400 may be examples of a decoder 215 described with reference to FIG. 2. FIG. 4A illustrates a side elevation view (cross-sectional) of a decoder 400-a in accordance with examples as disclosed herein. FIG. 4B illustrates a top plan view of a decoder 400-b along a section line A-A' illustrated in FIG. 4A. FIG. 4C illustrates a top plan view of a decoder 400-c along a section line B-B' illustrated in FIG. 4A. FIG. 4D illustrates a top plan view of a decoder 400-d along a section line C-C' illustrated in FIG. 4A.

As illustrated in FIG. 4A, the decoder 400-a may be coupled with an access line 440, for example via a contact 415. The access line 440 may be coupled with a memory cell of a memory array, such as a memory array 100 described with reference to FIG. 1. The decoder 400-a may be configured to bias the access line 440 as a part of access operations. The decoder 400-a may include a first stage 405, which may be an example of a first stage 220-a described with reference to FIG. 2. The first stage 405 may include CMOS pre-decoding circuitry.

The decoder 400-a may also include a first n-type transistor 430 and second n-type transistor 435, which may be examples of thin film transistors (TFTs). A junction 425-a (e.g., a source) of the first n-type transistor 430 may be coupled with a first conductive line 410-a via a contact 415-a. A junction 425-b (e.g., a source) of the second n-type transistor 435 may be coupled with a second conductive line 410 (e.g., conductive line 410-c as described with reference to FIG. 4B). The first conductive line 410-a may be coupled with a source node via a contact 415-b, and the second conductive line 410 may be coupled with a ground node. A junction 425-c (e.g., drain) of the first n-type transistor 430 may be coupled with a third conductive line 410-b via contact 415-c and a junction 425-d (e.g., drain) of the second n-type transistor 435 may be coupled with the third conductive line 410-b via contact 415-d.

The third conductive line 410-b may be coupled with the access line 440 via a contact 415-e. Components of the decoder 400-a may be separated from one another by dielectric material 420 (e.g., dielectric material 420-a and/or 420-b). In some examples, at least a portion of the decoder 400-a may be included in a CuA layer. The CuA layer may be composed of silicon, and may include CMOS circuitry and interconnect components for operating the memory array.

The first n-type transistor 430 may include a gate 445-a and the second n-type transistor 435 may include a gate 445-b. Gate 445-a may be coupled with a first gate node that enables the first n-type transistor 430 and gate 445-b may be coupled with a second gate node that enables the second n-type transistor 435. Gate 445-a may be coupled with dielectric material 437-a and gate 445-b may be coupled with dielectric material 437-b. Dielectric material 437-a, in turn, may be coupled with first doped material 432-a and dielectric material 437-b may be coupled with second doped material 432-b. Dielectric material 437-a may be configured to isolate gate 445-a from first doped material 432-a and dielectric material 437-b may be configured to isolate gate 445-b from second doped material 432-b.

In some examples, scaling down the size of memory cells in the memory array may have one or more advantages. For example, by scaling down the size of the memory cells, the overall size of the memory array may also be reduced. However, one or more components of the CuA layer that may not be efficiently scaled down with the size of the memory array, such as NMOS transistors or other components of the decoder 400-a or the CuA layer. To enable sufficient space for the decoder 400-a as the memory array is scaled down, the first n-type transistor 430 and the second n-type transistor 435 for biasing the access line 440 may be included in a layer between the CuA layer and the memory array. In such examples, the first n-type transistor 430 and the second n-type transistor 435 may be formed in a vertical fashion (e.g., formed perpendicular to the memory array and/or the CuA layer). Forming the first n-type transistor 430 and the second n-type transistor 435 in the vertical fashion may enable the first n-type transistor 430 and the second n-type transistor 435 to use less space in a horizontal direction (e.g., a direction parallel to the memory array and/or the CuA layer). As such, in examples that implement vertical transistors, the memory cells may scale to a smaller size than in examples that do not implement vertical transistors. In some examples, the layer may also include the CMOS pre-decoding circuitry of the first stage 405.

As illustrated in the bottom view of the decoder 400-b in FIG. 4B, the junction 425-a of the first n-type transistor 430 may be coupled with the first conductive line 410-a (not shown) through the dielectric material 420-a via the contact 415-a. The junction 425-b of the second n-type transistor 435 may be coupled with the second conductive line 410-c through the dielectric material 420-a via a contact 415-f. In some examples, the first and second conductive lines may be composed of tungsten. In some examples, the first conductive line may be parallel to the second conductive line.

The junction 425-c (e.g., a drain) of the first n-type transistor 430 may be coupled with contact 415-c and junction 425-d (e.g., a drain) of the second n-type transistor 435 may be coupled with contact 415-d. Additionally, as illustrated in the top view of the decoder 400-d in FIG. 4D, junction 425-c of the first n-type transistor 430 may be coupled with the conductive line 410-b through the dielectric material 420-b via the contact 415-c. Similarly, a junction 425-d of the second n-type transistor 435 may be coupled with the conductive line 410-b through the dielectric material 420-b via the contact 415-d. For instance, the conductive line 410-b may short the junctions 425-c and 425-d. The conductive line 410-b may be coupled with the access line 440 via the contact 415-e.

The first n-type transistor 430 and the second n-type transistor 435 may control which voltage source is coupled with the access line 440 based on a first gate voltage applied to the gate 445-a of the first n-type transistor 430 and a second gate voltage applied to gate 445-b of the second n-type transistor 435. For instance, a positive voltage may be applied to gate 445-a to activate first n-type transistor 430 and a negative voltage may be applied to gate 445-*b* to activate second n-type transistor 435. In such examples, gates 445-*a* and 445-*b* may be biased such that a voltage on first conductive line 410-*a* (e.g., a ground voltage or a source voltage) biases access line 440. Alternatively, a negative voltage may be applied to gate 445-*a* of the first n-type transistor 430 and a negative voltage may be applied to gate 445-*b* of the second n-type transistor 435. In such examples, gates 445-*a* and 445-*b* may be biased such that a ground voltage on a conductive line 410 coupled with junction 425-*b* biases the access line 440.

In some examples (e.g., when the memory array 205 above the second stage 220-*b* of the decoder 215 as described in FIG. 2 is a quilted multi-deck memory array), a via may be coupled with first n-type transistor 430 and second n-type transistor 435. For instance, the via may be coupled access line 440 at one terminal and with respective access lines for one or more decks of the memory array at the other terminal. Additionally or alternatively, gate 445-*a* and/or 445-*b* may be coupled with a conductive line 410 that is coupled with the gates 445-*a* and/or 445-*b* via conductive line 410-*b*. For instance, conductive line 410-*b* may be coupled with the conductive line 410 via a first contact 415 and the gates 445-*a* and/or 445-*b* via a second contact.

To form the decoder 400 (e.g., including decoders 400-*a*, 400-*b*, 400-*c*, or 400-*d*, a manufacturing device may perform one or more procedures. For instance, the manufacturing device may form a layer including first stage 405 and associated with an array of memory cells. The layer and the array of memory cells may extend in a first direction and a second direction. The manufacturing device may deposit conductive line 410-*a* and conductive line 410-*c* extending in the first direction based on forming the layer including the first stage 405. In some examples, the manufacturing device may form the conductive line 410-*a* and conductive line 410-*c* coupled with a dielectric material 420, where the layer including first stage 405 includes the dielectric material 420. In some examples, conductive line 410-*a* may be coupled with a source node and conductive line 410-*c* may be coupled with a ground node.

The manufacturing device may deposit dielectric material 420-*a* over conductive line 410-*a* and conductive line 410-*c*. The manufacturing device may form a first opening in the dielectric material 420-*a* that exposes conductive line 410-*a* and a second opening in the dielectric material 420-*a* that exposes conductive line 410-*c* by etching a portion of the dielectric material 420-*a*. The manufacturing device may deposit, into the first opening, a first material to form junction 425-*a* in contact with conductive line 410-*a*. Additionally, the manufacturing device may deposit, into the second opening, a second material to form junction 425-*b* in contact with conductive line 410-*c*. In some examples, the first material and the second material may include or be examples of a same material. In some such examples, the manufacturing device depositing into the first opening and depositing into the second opening may occur as a single step (e.g., the same material may be deposited into the first opening and the second opening substantially simultaneously).

The manufacturing device may deposit doped material 432-*a* to form first n-type transistor 430 in contact with junction 425-*a*. Additionally, the manufacturing device may deposit doped material 432-*b* to form second n-type transistor 435 in contact with junction 425-*b*. In some examples, doped material 432-*a* and doped material 432-*b* may include or be examples of a same doped material. In some such examples, the depositing to form first n-type transistor 430 and depositing to form second n-type transistor 435 may occur as a single step (e.g., the same doped material may be deposited to form first n-type transistor 430 and second n-type transistor 435 substantially simultaneously).

In some examples, the first n-type transistor 430 and the second n-type transistor 435 may include or be examples of a second stage of decoders 400-*a*, 400-*b*, 400-*c*, 400-*d*, or any combination thereof. In some examples, forming the first n-type transistor 430 includes the manufacturing device etching the first doped material 432-*a* to expose a first surface of the first doped material 432-*a* extending in a third direction based on depositing the first doped material. Additionally, the manufacturing device may deposit a first gate material (e.g., dielectric material 437-*a* and/or gate 445-*a*) in contact with the first surface of the first doped material 432-*a* based on etching the first doped material 432-*a*. In some examples, forming the second n-type transistor 435 includes the manufacturing device etching the second doped material 432-*b* to expose a second surface of the second doped material 432-*b* extending in the third direction based on depositing the second doped material 432-*b*. Additionally, the manufacturing device may deposit a second gate material (e.g., dielectric material 437-*b* and/or gate 445-*b*) in contact with the second surface of the second doped material 432-*b* based on etching the second doped material 432-*b*. In some examples, the manufacturing device may form a conductive line 410 in contact with the first gate material (e.g., gate 445-*a*) and a conductive line 410 in contact with the second gate material (e.g., gate 445-*b*), where both conductive lines 410 are isolated from each other. In some examples, forming the first n-type transistor 430 and the second n-type transistor 435 is based on forming conductive line 410-*a* and conductive line 410-*b* coupled with the dielectric material.

The manufacturing device may form conductive line 410-*b* in contact with first n-type transistor 430 and second n-type transistor 435 extending in the second direction based on depositing the first doped material and the second doped material. The manufacturing device may deposit dielectric material 420-*b* over conductive line 410-*b*. The manufacturing device may form a third opening over conductive line 410-*b* by etching a portion of dielectric material 420-*b*. The manufacturing device may form access line 440 coupled with conductive line 410-*b* via the third opening. The manufacturing device may form the array of memory cells (e.g., memory array 205 as described with reference to FIG. 2) based on depositing the first doped material and the second doped material. In some examples, forming the array of memory cells is based on forming the access line 440.

In some examples, conductive line 410-*b* and/or contact 415-*e* may not be included. Additionally or alternatively, access line 440 may extend in a diagonal direction relative to conductive line 410-*a*. In such examples, access line 440 may be coupled with contact 415-*c* and a contact 415 of another instance of the second n-type transistor 435 (e.g., conductive line 410-*b* may be isolated from contact 415-*d*) or access line 440 may be coupled with contact 415-*d* and a contact 415 of another instance of the first n-type transistor 430 (e.g., conductive line 410-*b* may be isolated from contact 415-*c*). In some such examples, the access line 440 may be coupled with a via (e.g., a via that is coupled at another terminal with one or more access lines of a multi-deck memory array).

Figure 5:
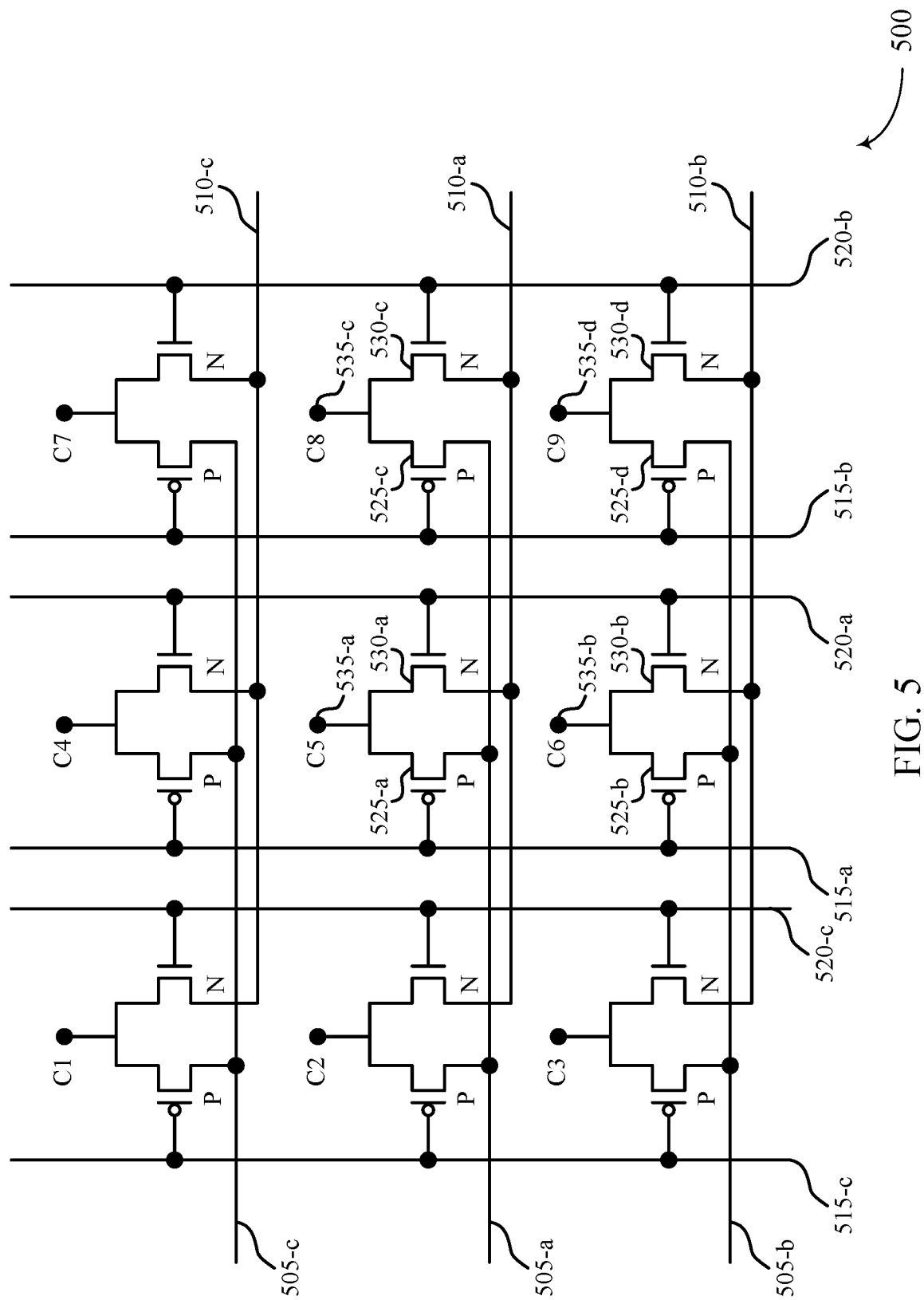
FIG. 5 illustrates an example of a circuit that supports decoding for a memory device in accordance with examples as disclosed herein.

FIG. 5 illustrates an example of a circuit 500 showing a biasing scheme that supports decoding for a memory device in accordance with examples as disclosed herein. In some examples, circuit 500 may include access lines 535-*a*, 535-*b*, 535-*c*, and 535-*d*, which may be examples of word lines 110 or digit lines 115 as described with reference to FIG. 1. In some examples, one or more of transistors 525-*a*, 525-*b*, 525-*c*, 525-*d*, 530-*a*, 530-*b*, 530-*c*, or 530-*d* may be examples of one or more components included in the second stage 220-*b* of the decoder 215 as described with reference to FIG. 2.

The decoder biasing scheme illustrated by circuit 500 may include a one or more source lines 505 (e.g., source lines 505-*a* and 505-*b*) and one or more ground lines 510 (e.g., ground lines 510-*a* and 510-*b*). Source lines 505-*a* and 505-*b* may be selectively biased to a source voltage or a ground voltage and ground lines 510-*a* and 510-*b* may be biased to a ground voltage. Additionally, the decoder biasing scheme illustrated by the circuit 500 may include one or more gate lines. For instance, the decoder biasing scheme illustrated by circuit 500 may include gate lines 515-*a*, 515-*b*, 520-*a*, and 520-*b*. Gate lines 515-*a* and 515-*b* may be coupled with a gate of one or more respective transistors 525. For instance, gate line 515-*a* may be coupled with gates of transistors 525-*a* and 525-*b* and gate line 515-*b* may be coupled with gates of transistors 525-*c* and 525-*d*. Gate lines 520-*a* and 520-*b* may be coupled with a gate of one or more respective transistors 530. For instance, gate line 520-*a* may be coupled with gates of transistors 530-*a* and 530-*b* and gate line 520-*b* may be coupled with gates of transistors 530-*c* and 530-*d*.

Each transistor 525 may be coupled at a first terminal (e.g., one of a source or drain) with a respective source line 505. For instance, transistors 525-*a* and 525-*c* may be coupled with source line 505-*a* and transistors 525-*b* and 525-*d* may be coupled with source line 505-*b*. Each transistor 530 may be coupled at a first terminal (e.g., one of a source or drain) with a respective ground line 510. For instance, transistors 530-*a* and 530-*c* may be coupled with ground line 510-*a* and transistors 530-*b* and 530-*d* may be coupled with ground line 510-*b*. Each transistor 525 and 530 may be coupled at a second terminal (e.g., the other of the source or drain) with a respective access line 535. For instance, transistors 525-*a* and 530-*a* may be coupled with access line 535-*a*, transistors 525-*b* and 530-*b* may be coupled with access line 535-*b*, transistors 525-*c* and 530-*c* may be coupled with access line 535-*c*, and transistors 525-*d* and 530-*d* may be coupled with access line 535-*d*. In some examples, each transistor 525 and 530 may be an n-type transistor.

In some examples, each transistor 525 may be operable to selectively couple a respective source line 505 with a respective access line 535. For instance, transistor 525-*a* may selectively couple source line 505-*a* with access line 535-*a*, transistor 525-*b* may selectively couple source line 505-*b* with access line 535-*b*, transistor 525-*c* may selectively couple source line 505-*a* with access line 535-*c*, and transistor 525-*d* may selectively couple source line 505-*b* with access line 535-*d*. In some examples, each transistor 530 may be operable to selective couple a respective ground line 510 with a respective access line 535. For instance, transistor 530-*a* may selectively couple ground line 510-*a* with access line 535-*a*, transistor 530-*b* may selectively couple ground line 510-*b* with access line 535-*b*, transistor 530-*c* may selectively couple ground line 510-*a* with access line 535-*c*, and transistor 530-*d* may selectively couple ground line 510-*b* with access line 535-*d*. Each pair of transistors (e.g., transistor 525-*a* with transistor 530-*a*, transistor 525-*b* with transistor 530-*b*, transistor 525-*c* with transistor 530-*c*, and transistor 525-*d* with transistor 530-*d*) may be referred to as a cell.

In some examples, one or more source lines 505 and one or more gate lines 515 and/or 520 may be selectively biased to bias access line 535-*a* to a source voltage (e.g., +3.1V). For instance, in one example, source line 505-*a* may be biased to a first voltage (e.g., +3.1V) and one or more other source lines 505 including source line 505-*b* may be biased to a second voltage (e.g., a ground voltage). Additionally, gate line 515-*a* may be biased to a third voltage (e.g., +4.5 V), gate line 520-*a* may be biased to a fourth voltage (e.g., −3.1V), gate line 515-*b* may be biased to a fifth voltage (e.g., −3.1V), and gate line 520-*d* may be biased to a sixth voltage (e.g., +3.1V). In a positive biasing scheme (e.g., a scheme in which a positive pulse is applied to access line 535-*a*), the voltage on source line 505-*a* may be positive (e.g., +3.1V). Additionally, the third voltage and the sixth voltage may have different values. In a negative biasing scheme (e.g., a scheme in which a negative pulse is applied to access line 535-*a*), the voltage on source line 505-*b* may be negative (e.g., −3.1V). Additionally, the third voltage and the sixth voltage may have the same value (e.g., may both be +3.1V). In some examples, the fourth voltage and the fifth voltage may have the same value. In some examples, each source line 505 may be biased by a first stage of a decoder (e.g., first stage 220-*a* of a decoder 215 as described with reference to FIG. 2).

Due to gate line 515-*a* having the third voltage (e.g., +4.5V), transistor 525-*a* may couple source line 505-*a* with access line 535-*a* and transistor 525-*b* may couple source line 505-*b* with access line 535-*b* (e.g., transistors 525-*a* and 525-*b* may be activated). Additionally, due to gate line 520-*b* having the fourth voltage (e.g., −3.1V), transistor 530-*a* may isolate ground line 510-*a* from access line 535-*a* and transistor 530-*b* may isolate ground line 510-*b* from access line 535-*b* (e.g., transistors 530-*a* and 530-*b* may be deactivated). Accordingly, access line 535-*a* may be biased (e.g., via source line 505-*a*) to the first voltage and access line 535-*b* may be biased (e.g., via source line 505-*b*) to the second voltage.

Due to gate line 515-*b* having the fifth voltage (e.g., −3.1V), transistor 525-*c* may isolate source line 505-*a* from access line 535-*c* and transistor 525-*d* may isolate source line 505-*b* from access line 535-*d* (e.g., transistors 525-*c* and 525-*d* may be deactivated). Additionally, due to gate line 520-*b* having the sixth voltage (e.g., +3.1V), transistor 530-*c* may couple ground line 510-*a* with access line 535-*c* and transistor 530-*d* may couple ground line 510-*b* with access line 535-*d* (e.g., transistors 530-*c* and 530-*d* may be activated). Ground lines 510-*a* and 510-*b* may be biased to the second voltage (e.g., the ground voltage). Accordingly, access lines 535-*c* and 535-*d* may be biased (e.g., via ground lines 510-*a* and 510-*b*, respectively) to the second voltage.

By biasing access line 535-*a* to the first voltage (e.g., +3.1V in the positive biasing scheme and −3.1V in the negative biasing scheme), access line 535-*a* may be in activated state and may bias one or more memory cells coupled with access line 535-*a*. In such examples, the cell including transistors 525-*a* and 530-*a* may be referred to as a selected cell. Additionally, by biasing access lines 535-*b*, 535-*c*, and 535-*d* to the second voltage (e.g., the ground voltage), access lines 535-*b*, 535-*c*, and 535-*d* may be in a deactivated state and may not bias one or more memory cells coupled with access line 535-*b*, 535-*c* and 535-*d*. In such examples, the cell including transistors 525-*b* and 530-*b*, the cell including transistors 525-*c* and 530-*c*, and the cell including transistors 525-*d* and 530-*d* may be referred to as unselected cells.

An example of biasing scheme to select the access line (C5) is described. To apply a positive voltage (e.g., +3.1V) to the access line (C5), the source line 505-*a* may be biased to a first positive voltage (e.g., +3.1V) and the other source lines (e.g., source line 505-*b* and source line 505-*c*) may be biased to a ground voltage. The ground lines 510 (e.g., ground line 510-*a*, 510-*b*, and 510-*c*) may be biased to a ground voltage. The gate line 515-*a* associated with the access line (C5) may be biased to a second positive voltage (e.g., +4.5V) and the gate line 520-*a* associated with the access line (C5) may be biased to a negative voltage (e.g., −3.1V). To ensure that the other access lines (e.g., C1-C4 and C6-C9) remain unbiased or biased to a ground voltage, different voltages may be applied to different gate lines 515 and 520. For example, the gate lines 515-*b* and 515-*c* may be biased to the negative voltage (e.g., −3.1V) and the gate lines 520-*b* and 520-*c* may be biased to the first positive voltage (e.g., +3.1V). In this manner, a positive voltage (e.g., +3.1V) may be applied to the access line (C5) while ground voltages are applicated to the other access lines (e.g., C1-C4 and C6-C9). Such a configuration may allow a decoder to target a single memory cell and reduce disturbances on other memory cells.

Figure 6:
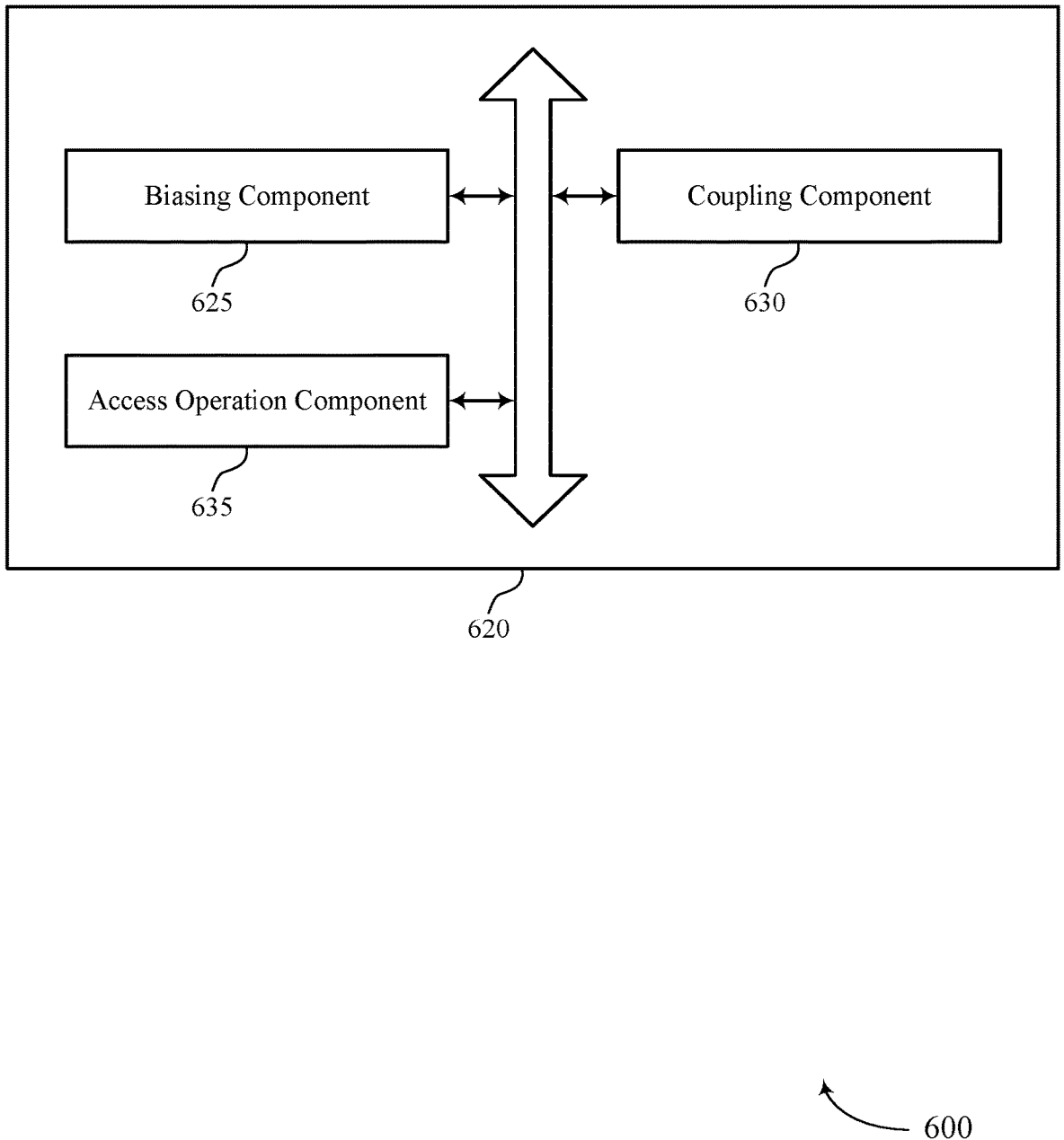
FIG. 6 shows a block diagram of a memory device that supports decoding for a memory device in accordance with examples as disclosed herein.

FIG. 6 shows a block diagram 600 of a memory device 620 that supports decoding for a memory device in accordance with examples as disclosed herein. The memory device 620 may be an example of aspects of a memory device as described with reference to FIGS. 1 through 5. The memory device 620, or various components thereof, may be an example of means for performing various aspects of decoding for a memory device as described herein. For example, the memory device 620 may include a biasing component 625, a coupling component 630, an access operation component 635, or any combination thereof. Each of these components may communicate, directly or indirectly, with one another (e.g., via one or more buses).

The biasing component 625 may be configured as or otherwise support a means for biasing, using a first stage of a decoder, a source node to a first voltage as part of an access operation on a memory array. The coupling component 630 may be configured as or otherwise support a means for coupling, using a second stage of the decoder, the source node or a ground node with an access line of the memory array. In some examples, the biasing component 625 may be configured as or otherwise support a means for biasing a memory cell of the memory array coupled with the access line based at least in part on coupling the source node or the ground node with the access line. The access operation component 635 may be configured as or otherwise support a means for performing the access operation on the memory cell based at least in part on biasing the memory cell.

In some examples, to support coupling the source node or the ground node with the access line, the biasing component 625 may be configured as or otherwise support a means for biasing a first gate of a first n-type transistor to a second voltage and a second gate of a second n-type transistor to a third voltage.

In some examples, to support coupling the source node or the ground node with the access line, the coupling component 630 may be configured as or otherwise support a means for activating the first n-type transistor based at least in part on biasing the first gate of the first n-type transistor to the second voltage, where the source node is coupled with the access line based at least in part on activating the first n-type transistor. In some examples, to support coupling the source node or the ground node with the access line, the coupling component 630 may be configured as or otherwise support a means for deactivating the second n-type transistor based at least in part on biasing the second gate of the second n-type transistor to the third voltage, where the ground node is isolated from the access line based at least in part on deactivating the second n-type transistor.

In some examples, activating the first n-type transistor is based on the second voltage being positive. In some examples, deactivating the second n-type transistor is based on the third voltage being negative.

In some examples, to support coupling the source node or the ground node with the access line, the coupling component 630 may be configured as or otherwise support a means for activating the second n-type transistor based at least in part on biasing the second gate of the second n-type transistor to the third voltage, where the ground node is coupled with the access line based at least in part on activating the second n-type transistor. In some examples, to support coupling the source node or the ground node with the access line, the coupling component 630 may be configured as or otherwise support a means for deactivating the first n-type transistor based at least in part on biasing the first gate of the first n-type transistor to the second voltage, where the source node is isolated from the access line based at least in part on deactivating the first n-type transistor.

In some examples, activating the first n-type transistor is based at least in part on the second voltage being negative, and deactivating the second n-type transistor is based at least in part on the third voltage being positive.

Figure 7:
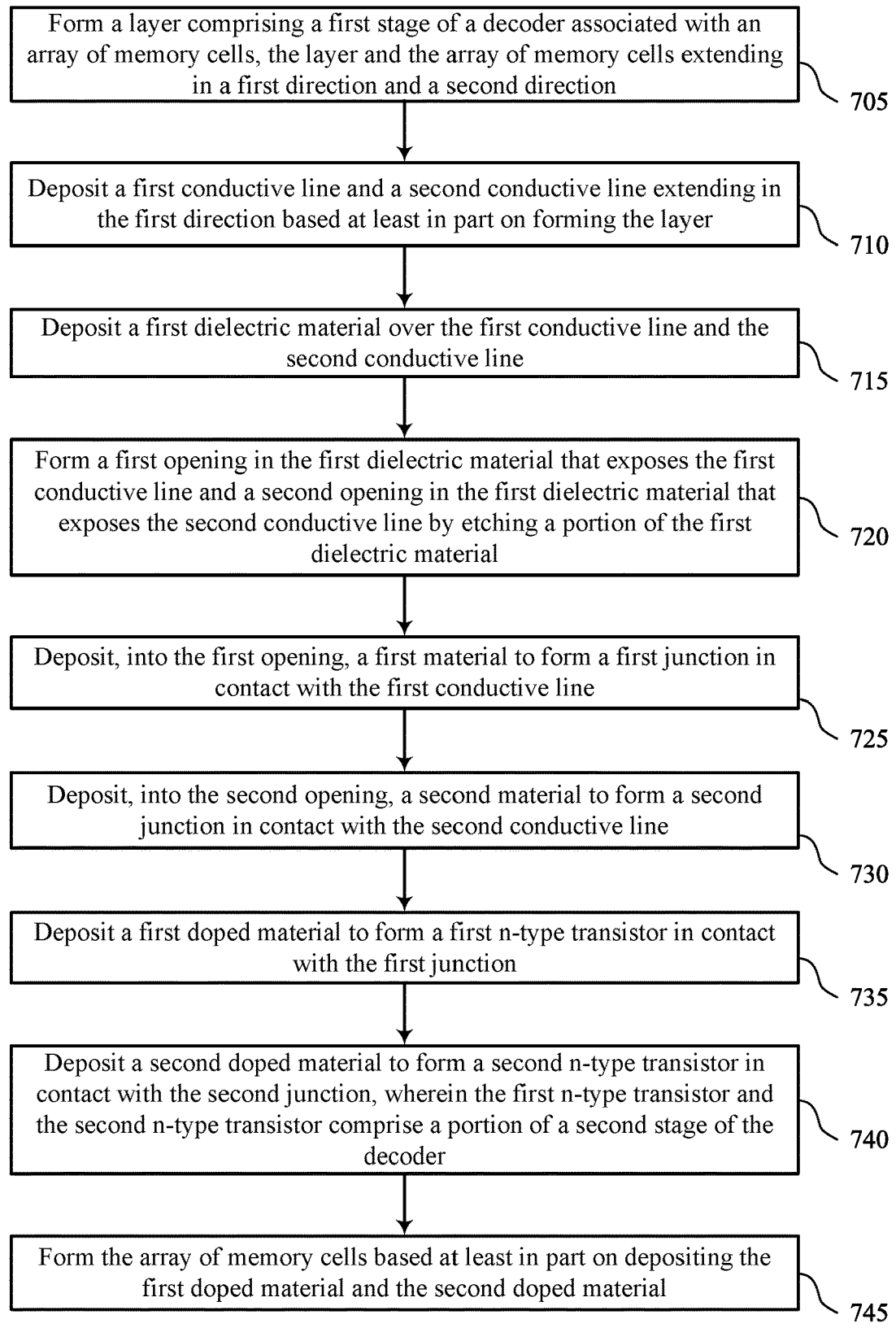
FIGS. 7 and 8 show flowcharts illustrating a method or methods that support decoding for a memory device in accordance with examples as disclosed herein.

FIG. 7 shows a flowchart illustrating a method or methods 700 that supports decoding for a memory device in accordance with examples as disclosed herein. The operations of method 700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method may include forming a layer including a first stage of a decoder associated with an array of memory cells, the layer and the array of memory cells extending in a first direction and a second direction. The operations of 705 may be performed in accordance with examples as disclosed herein.

At 710, the method may include depositing a first conductive line and a second conductive line extending in the first direction based at least in part on forming the layer. The operations of 710 may be performed in accordance with examples as disclosed herein.

At 715, the method may include depositing a first dielectric material over the first conductive line and the second conductive line.

At 720, the method may include forming a first opening in the first dielectric material that exposes the first conductive line and a second opening in the first dielectric material that exposes the second conductive line by etching a portion of the first dielectric material.

At 725, the method may include depositing, into the first opening, a first material to form a first junction in contact with the first conductive line. The operations of 725 may be performed in accordance with examples as disclosed herein.

At 730, the method may include depositing, into the second opening, a second material to form a second junction in contact with the second conductive line. In some examples, the first material and the second material may include or be examples of a same material. In some such examples, the depositing into the first opening and the depositing into the second opening may occur as a single step (e.g., the same material may be deposited into the first opening and the second opening substantially simultaneously). The operations of 730 may be performed in accordance with examples as disclosed herein.

At 735, the method may include depositing a first doped material to form a first n-type transistor in contact with the first junction. The operations of 735 may be performed in accordance with examples as disclosed herein.

At 740, the method may include depositing a second doped material to form a second n-type transistor in contact with the second junction, where the first n-type transistor and the second n-type transistor include a portion of a second stage of the decoder. In some examples, the first doped material and the second doped material may include or be examples of a same doped material. In some such examples, the depositing to form the first n-type transistor and the depositing to form the second n-type transistor may occur as a single step (e.g., the same doped material may be deposited to form the first n-type transistor and the second n-type transistor substantially simultaneously). The operations of 740 may be performed in accordance with examples as disclosed herein.

At 745, the method may include forming the array of memory cells based at least in part on depositing the first doped material and the second doped material. The operations of 745 may be performed in accordance with examples as disclosed herein.

In some examples, an apparatus as described herein may perform a method or methods, such as the method 700. The apparatus may include, features, circuitry, logic, means, or instructions (e.g., a non-transitory computer-readable medium storing instructions executable by a processor) for forming a layer including a first stage of a decoder associated with an array of memory cells, the layer and the array of memory cells extending in a first direction and a second direction; depositing a first conductive line and a second conductive line extending in the first direction based at least in part on forming the layer; depositing a first dielectric material over the first conductive line and the second conductive line; forming a first opening in the first dielectric material that exposes the first conductive line and a second opening in the first dielectric material that exposes the second conductive line by etching a portion of the first dielectric material; depositing, into the first opening, a first material to form a first junction in contact with the first conductive line; depositing, into the second opening, a second material to form a second junction in contact with the second conductive line; depositing a first doped material to form a first n-type transistor in contact with the first junction; depositing a second doped material to form a second n-type transistor in contact with the second junction, where the first n-type transistor and the second n-type transistor include a portion of a second stage of the decoder; and forming the array of memory cells based at least in part on depositing the first doped material and the second doped material.

Some examples of the method 700 and the apparatus described herein may further include operations, features, circuitry, logic, means, or instructions for forming a third conductive line in contact with the first n-type transistor and the second n-type transistor and extending in the second direction based at least in part on depositing the first doped material and the second doped material; depositing a second dielectric material over the third conductive line; forming a third opening over the third conductive line by etching a portion of the second dielectric material; and forming an access line coupled with the third conductive line via the third opening, where forming the array of memory cells may be based at least in part on forming the access line.

In some examples of the method 700 and the apparatus described herein, forming the first n-type transistor and the second n-type transistor may include operations, features, circuitry, logic, means, or instructions for etching the first doped material to expose a first surface of the first doped material extending in a third direction based at least in part on depositing the first doped material; depositing a first gate material in contact with the first surface of the first doped material based at least in part on etching the first doped material; etching the second doped material to expose a second surface of the second doped material extending in the third direction based at least in part on depositing the second doped material; and depositing a second gate material in contact with the second surface of the second doped material based at least in part on etching the second doped material.

Some examples of the method 700 and the apparatus described herein may further include operations, features, circuitry, logic, means, or instructions for forming a fourth conductive line in contact with the first gate material and a fifth conductive line in contact with the second gate material, where the fourth conductive line may be isolated from the fifth conductive line.

Some examples of the method 700 and the apparatus described herein may further include operations, features, circuitry, logic, means, or instructions for forming the first conductive line and the second conductive line coupled with a third dielectric material, where the layer including the first stage of the decoder includes the third dielectric material, and where forming the first n-type transistor and the second n-type transistor may be based at least in part on forming the first conductive line and the second conductive line coupled with the third dielectric material.

In some examples of the method 700 and the apparatus described herein, the first conductive line may be coupled with a source node and the second conductive line may be coupled with a ground node.

Figure 8:
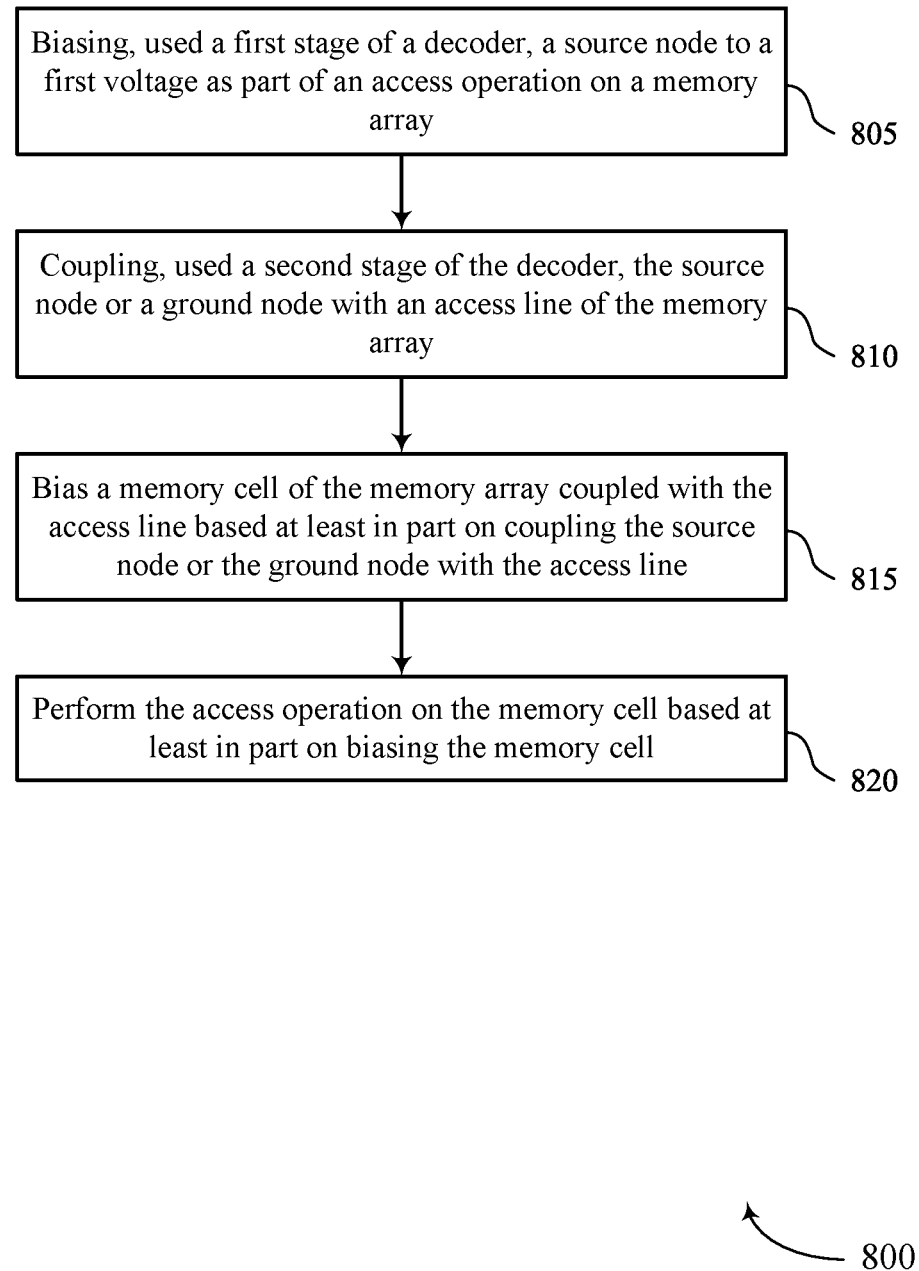

FIG. 8 shows a flowchart illustrating a method 800 that supports decoding for a memory device in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 805, the method may include biasing, using a first stage of a decoder, a source node to a first voltage as part of an access operation on a memory array. The operations of 805 may be performed in accordance with examples as disclosed herein. In some examples, aspects of the operations of 805 may be performed by a biasing component 625 as described with reference to FIG. 6.

At 810, the method may include coupling, using a second stage of the decoder, the source node or a ground node with an access line of the memory array. The operations of 810 may be performed in accordance with examples as disclosed herein. In some examples, aspects of the operations of 810 may be performed by a coupling component 630 as described with reference to FIG. 6.

At 815, the method may include biasing a memory cell of the memory array coupled with the access line based at least in part on coupling the source node or the ground node with the access line. The operations of 815 may be performed in accordance with examples as disclosed herein. In some examples, aspects of the operations of 815 may be performed by a biasing component 625 as described with reference to FIG. 6.

At 820, the method may include performing the access operation on the memory cell based at least in part on biasing the memory cell. The operations of 820 may be performed in accordance with examples as disclosed herein. In some examples, aspects of the operations of 820 may be performed by an access operation component 635 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for biasing, using a first stage of a decoder, a source node to a first voltage as part of an access operation on a memory array; coupling, using a second stage of the decoder, the source node or a ground node with an access line of the memory array; biasing a memory cell of the memory array coupled with the access line based at least in part on coupling the source node or the ground node with the access line; and performing the access operation on the memory cell based at least in part on biasing the memory cell.

In some examples of the method 800 and the apparatus described herein, coupling the source node or the ground node with the access line may include operations, features, circuitry, logic, means, or instructions for biasing a first gate of a first n-type transistor to a second voltage and a second gate of a second n-type transistor to a third voltage.

In some examples of the method 800 and the apparatus described herein, coupling the source node or the ground node with the access line may include operations, features, circuitry, logic, means, or instructions for activating the first n-type transistor based at least in part on biasing the first gate of the first n-type transistor to the second voltage, where the source node may be coupled with the access line based at least in part on activating the first n-type transistor and deactivating the second n-type transistor based at least in part on biasing the second gate of the second n-type transistor to the third voltage, where the ground node may be isolated from the access line based at least in part on deactivating the second n-type transistor.

Some examples of the method 800 and the apparatus described herein may further include operations, features, circuitry, logic, means, or instructions for activating the first n-type transistor may be based at least in part on the second voltage being positive, and deactivating the second n-type transistor may be based at least in part on the third voltage being negative.

In some examples of the method 800 and the apparatus described herein, coupling the source node or the ground node with the access line may include operations, features, circuitry, logic, means, or instructions for activating the second n-type transistor based at least in part on biasing the second gate of the second n-type transistor to the third voltage, where the ground node may be coupled with the access line based at least in part on activating the second n-type transistor and deactivating the first n-type transistor based at least in part on biasing the first gate of the first n-type transistor to the second voltage, where the source node may be isolated from the access line based at least in part on deactivating the first n-type transistor.

Some examples of the method 800 and the apparatus described herein may further include operations, features, circuitry, logic, means, or instructions for activating the first n-type transistor based at least in part on the second voltage being negative and deactivating the second n-type transistor based at least in part on the third voltage being positive.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array including, a memory cell, an access line coupled with the memory cell, and a decoder coupled with the access line and configured to bias the access line to one or more voltages, the decoder including, a first n-type transistor coupled with a source node and the access line, the source node configured to bias the access line to a voltage based at least in part on operation of the first n-type transistor, and a second n-type transistor coupled with a ground node and the access line, the ground node configured to bias the access line to ground based at least in part on operation of the second n-type transistor In some examples of the apparatus, the first n-type transistor includes a first gate, a first source terminal coupled with the source node, and a first drain terminal coupled with the access line; the second n-type transistor includes a second gate, a second drain terminal coupled with the ground node, and a second source terminal coupled with the access line; and the decoder may be further configured to bias the first gate to a second voltage and the second gate to a third voltage different from the second voltage.

In some examples of the apparatus, a die of the memory array extends in a first direction and a second direction and the first n-type transistor and the second n-type transistor may be vertical transistors extending in a third direction orthogonal to the first direction and the second direction.

In some examples of the apparatus, the source node may be further configured to bias the access line to a first voltage based at least in part on the first gate of the first n-type transistor being biased to the second voltage, and the ground node may be further configured to be isolated from the access line based at least in part on the second gate of the second n-type transistor being biased to the third voltage.

In some examples of the apparatus, the source node may be further configured to isolate a first voltage from the access line based at least in part on the first gate of the first n-type transistor being biased to the second voltage, and the ground node may be further configured to bias the access line to a ground voltage based at least in part on the second gate of the second n-type transistor being biased to the third voltage.

In some examples of the apparatus, the first source terminal of the first n-type transistor may be coupled with the source node, the second drain terminal of the second n-type transistor may be coupled with the ground node, and the first drain terminal of the first n-type transistor and the second source terminal of the second n-type transistor may be coupled with the access line.

In some examples of the apparatus, the apparatus may include a second memory cell and a second access line coupled with the memory cell, where the decoder may be coupled with the second access line and may be configured to bias the second access line to the one or more voltages, where the decoder further includes a third n-type transistor coupled with the source node and the second access line, the source node further configured to bias the second access line to the voltage based at least in part on operation of the third n-type transistor, where the third n-type transistor includes a third gate, and where the decoder may be further configured to bias the third gate to a different voltage from the second voltage when the decoder biases the first gate to the second voltage, and a fourth n-type transistor coupled with the ground node and the second access line, the ground node further configured to bias the second access line to ground based at least in part on operation of the fourth n-type transistor, where the fourth n-type transistor includes a fourth gate, and where the decoder may be further configured to bias the fourth gate to a different voltage from the third voltage when the decoder biases the second gate to the third voltage.

In some examples of the apparatus, the apparatus may include a second memory cell and a second access line coupled with the memory cell, where the decoder may be coupled with the second access line and may be configured to bias the second access line to the one or more voltages, where the decoder further includes, a third n-type transistor coupled with a second source node and the second access line, the second source node configured to bias the second access line to the voltage based at least in part on operation of the third n-type transistor, where the third n-type transistor includes a third gate, where the decoder may be further configured to bias the third gate to the second voltage when the decoder biases the first gate to the second voltage, and a fourth n-type transistor coupled with a second ground node and the second access line, the second ground node configured to bias the second access line to ground based at least in part on operation of the fourth n-type transistor, where the fourth n-type transistor includes a fourth gate, where the decoder may be further configured to bias the fourth gate to the third voltage when the decoder biases the second gate to the third voltage.

In some examples of the apparatus, the apparatus may include a second memory cell and a second access line coupled with the memory cell, where the decoder may be coupled with the second access line and may be configured to bias the second access line to the one or more voltages, where the decoder further includes, a third n-type transistor coupled with a second source node and the second access line, the second source node configured to bias the second access line to the voltage based at least in part on operation of the third n-type transistor, where the third n-type transistor includes a third gate, and where the decoder may be further configured to bias the third gate to a different voltage from the second voltage when the decoder biases the first gate to the second voltage, and a fourth n-type transistor coupled with a second ground node and the second access line, the second ground node configured to bias the second access line to ground based at least in part on operation of the fourth n-type transistor, where the fourth n-type transistor includes a fourth gate, and where the decoder may be further configured to bias the third gate to a different voltage from the third voltage when the decoder biases the second gate to the third voltage.

In some examples of the apparatus, the first n-type transistor may be configured to be activated based at least in part on the second voltage being positive, and the second n-type transistor may be configured to be deactivated based at least in part on the second voltage being negative.

In some examples of the apparatus, the memory cell includes a storage element formed of chalcogenide material coupled with the access line and a word line.

In some examples of the apparatus, the access line includes a pillar extending in a direction non-parallel to a plane defined by the memory array.

In some examples of the apparatus, the pillar may be one of a plurality of pillars distributed in a first pattern in the memory array, the decoder includes a plurality of decoding elements positioned between the memory array and a layer of components associated with the memory array, and the plurality of decoding elements may be distributed in a second pattern in the memory array such that each decoding element of the plurality of decoding elements may be at a same position relative to at least one respective pillar of the plurality of pillars.

Another apparatus is described. The apparatus may include a substrate extending in a first direction and a second direction and a memory array including a memory cell, a pillar configured as a digit line and coupled with the memory cell, the pillar extending in a third direction different than the first direction and the second direction, a word line coupled with the memory cell in the second direction parallel with the substrate, and a decoder coupled with the pillar and including a first stage and a second stage, the first stage of the decoder positioned in a first layer including one or more logic circuits associated with operating the memory array, the second stage of the decoder positioned in a second layer between the first layer and the memory array, the second stage of the decoder including a first vertical transistor coupled with a source node and the pillar, the source node configured to bias the pillar to a first voltage based at least in part on operation of the first vertical transistor, the first vertical transistor including a first doped material that extends in the third direction, and a second vertical transistor coupled with a ground node and the pillar, the ground node configured to bias the pillar to ground based at least in part on operation of the second vertical transistor, the second vertical transistor including a second doped material that extends in the third direction In some examples of the apparatus, the first vertical transistor includes a first gate, the second vertical transistor includes a second gate, and the first stage of the decoder may be configured to bias the first gate of a first n-type transistor to a second voltage and the second gate of a second n-type transistor to a third voltage.

In some examples of the apparatus, the source node may be further configured to bias the pillar to the first voltage based at least in part on the first gate of the first n-type transistor being biased to the second voltage, and the ground node may be further configured to be isolated from the pillar based at least in part on the second gate of the second n-type transistor being biased to the third voltage.

In some examples of the apparatus, the source node may be further configured to isolate the first voltage from the pillar based at least in part on the first gate of the first n-type transistor being biased to the second voltage, and the ground node may be further configured to bias the pillar to a ground voltage based at least in part on the second gate of the second n-type transistor being biased to the third voltage.

In some examples of the apparatus, the first vertical transistor may be coupled with the source node via a first conductive line extending in the first direction, the second vertical transistor may be coupled with the ground node via a second conductive line extending in the first direction and parallel to the first conductive line, and the first vertical transistor and the second vertical transistor may be coupled with the pillar via a third conductive line extending the second direction.

In some examples of the apparatus, the memory cell includes a storage element formed of chalcogenide material coupled with the pillar and the word line.

In some examples of the apparatus, the pillar may be one of a plurality of pillars distributed in a first pattern in the memory array, the decoder includes a plurality of decoding elements that each include the first vertical transistor and the second vertical transistor, and the plurality of decoding elements may be distributed in a second pattern in the memory array such that each decoding element of the plurality of decoding elements may be at a same position relative to at least one respective pillar of the plurality of pillars.

Another apparatus is described. The apparatus may include a memory array, a decoder including a first stage and a second stage and coupled with the memory array, and a controller coupled with the decoder and the memory array, the controller operable to cause the apparatus to bias, using the first stage of the decoder, a source node to a first voltage as part of an access operation on the memory array, couple, using the second stage of the decoder, the source node or a ground node with an access line of the memory array, bias a memory cell of the memory array coupled with the access line based at least in part on coupling the source node or the ground node with the access line, and perform the access operation on the memory cell based at least in part on biasing the memory cell.

In some examples of the apparatus, the decoder includes a first n-type transistor and a second n-type transistor, where the first n-type transistor may have a first gate and the second n-type transistor may have a second gate and the controller may be further operable to cause the apparatus to bias the first gate of the first n-type transistor to a second voltage and the second gate of the second n-type transistor to a third voltage.

In some examples of the apparatus, the controller being operable to cause the apparatus to couple the source node or the ground node with the access line includes the controller being operable to cause the apparatus to activate the first n-type transistor based at least in part on biasing the first gate of the first n-type transistor to the second voltage, where the source node may be coupled with the access line based at least in part on activating the first n-type transistor and deactivate the second n-type transistor based at least in part on biasing the second gate of the second n-type transistor to the third voltage, where the ground node may be isolated from the access line based at least in part on deactivating the second n-type transistor.

In some examples of the apparatus, activating the first n-type transistor may be based on the second voltage being positive and deactivating the second n-type transistor may be based on the third voltage being negative.

In some examples of the apparatus, the controller being operable to cause the apparatus to couple the source node or the ground node with the access line includes the controller being operable to activate the second n-type transistor based at least in part on biasing the second gate of the second n-type transistor to the third voltage, where the ground node may be coupled with the access line based at least in part on activating the second n-type transistor and deactivate the first n-type transistor based at least in part on biasing the first gate of the first n-type transistor to the second voltage, where the source node may be isolated from the access line based at least in part on deactivating the first n-type transistor.

In some examples of the apparatus, activating the first n-type transistor may be based on the second voltage being negative and deactivating the second n-type transistor may be based on the third voltage being positive.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array, wherein a die of the memory array extends in a first direction and a second direction, the memory array comprising:
   a memory cell;
   an access line coupled with the memory cell; and
   a decoder coupled with the access line and configured to bias the access line to one or more voltages, the decoder comprising:
   a first n-type transistor coupled with a source node and the access line and positioned in a layer between the memory cell and logic circuits; and
   a second n-type transistor coupled with a ground node and the access line and positioned within the layer, wherein the first n-type transistor and the second n-type transistor are vertical transistors extending in a third direction orthogonal to the first direction and the second direction.

2. The apparatus of claim 1, wherein:
   the first n-type transistor comprises a first gate, a first source terminal coupled with the source node, and a first drain terminal coupled with the access line;
   the second n-type transistor comprises a second gate, a second drain terminal coupled with the ground node, and a second source terminal coupled with the access line; and
   the decoder is further configured to bias the first gate to a second voltage and the second gate to a third voltage different from the second voltage.

3. The apparatus of claim 2, wherein the source node is further configured to bias the access line to a first voltage based at least in part on the first gate of the first n-type transistor being biased to the second voltage, and wherein the ground node is further configured to be isolated from the access line based at least in part on the second gate of the second n-type transistor being biased to the third voltage.

4. The apparatus of claim 2, wherein the source node is further configured to isolate a first voltage from the access line based at least in part on the first gate of the first n-type transistor being biased to the second voltage, and wherein the ground node is further configured to bias the access line to a ground voltage based at least in part on the second gate of the second n-type transistor being biased to the third voltage.

5. The apparatus of claim 2, wherein:
   the first source terminal of the first n-type transistor is coupled with the source node;
   the second drain terminal of the second n-type transistor is coupled with the ground node; and
   the first drain terminal of the first n-type transistor and the second source terminal of the second n-type transistor are coupled with the access line.

6. The apparatus of claim 2, further comprising:
   a second memory cell; and
   a second access line coupled with the memory cell, wherein the decoder is coupled with the second access line and is configured to bias the second access line to the one or more voltages, wherein the decoder further comprises:
   a third n-type transistor coupled with the source node and the second access line, the source node further configured to bias the second access line to a voltage based at least in part on operation of the third n-type transistor, wherein the third n-type transistor comprises a third gate, and wherein the decoder is further configured to bias the third gate to a first bias voltage different from the second voltage when the decoder biases the first gate to the second voltage; and
   a fourth n-type transistor coupled with the ground node and the second access line, the ground node further configured to bias the second access line to ground based at least in part on operation of the fourth n-type transistor, wherein the fourth n-type transistor comprises a fourth gate, and wherein the decoder is further configured to bias the fourth gate to a second bias voltage different from the third voltage when the decoder biases the second gate to the third voltage.

7. The apparatus of claim 2, further comprising:
   a second memory cell; and
   a second access line coupled with the memory cell, wherein the decoder is coupled with the second access line and is configured to bias the second access line to the one or more voltages, wherein the decoder further comprises:
   a third n-type transistor coupled with a second source node and the second access line, the second source node configured to bias the second access line to a voltage based at least in part on operation of the third n-type transistor, wherein the third n-type transistor comprises a third gate, wherein the decoder is further configured to bias the third gate to the second voltage when the decoder biases the first gate to the second voltage; and
   a fourth n-type transistor coupled with a second ground node and the second access line, the second ground node configured to bias the second access line to ground based at least in part on operation of the fourth n-type transistor, wherein the fourth n-type transistor comprises a fourth gate, wherein the decoder is further configured to bias the fourth gate to the third voltage when the decoder biases the second gate to the third voltage.

8. The apparatus of claim 2, further comprising:
   a second memory cell; and
   a second access line coupled with the memory cell, wherein the decoder is coupled with the second access line and is configured to bias the second access line to the one or more voltages, wherein the decoder further comprises:
   a third n-type transistor coupled with a second source node and the second access line, the second source node configured to bias the second access line to a voltage based at least in part on operation of the third n-type transistor, wherein the third n-type transistor comprises a third gate, and wherein the decoder is further configured to bias the third gate to a first bias voltage different from the second voltage when the decoder biases the first gate to the second voltage; and
   a fourth n-type transistor coupled with a second ground node and the second access line, the second ground node configured to bias the second access line to ground based at least in part on operation of the fourth n-type transistor, wherein the fourth n-type transistor comprises a fourth gate, and wherein the decoder is further configured to bias the third gate to a second bias voltage different from the third voltage when the decoder biases the second gate to the third voltage.

9. The apparatus of claim 2, wherein the first n-type transistor is configured to be activated based at least in part on the second voltage being positive, and
wherein the second n-type transistor is configured to be deactivated based at least in part on the second voltage being negative.

10. The apparatus of claim 1, wherein the memory cell comprises:
a storage element formed of chalcogenide material coupled with the access line and a word line.

11. The apparatus of claim 1, wherein the access line comprises a pillar extending in the third direction and non-parallel to a plane defined by the memory array.

12. The apparatus of claim 11, wherein:
the pillar is one of a plurality of pillars distributed in a first pattern in the memory array;
the decoder comprises a plurality of decoding elements positioned between the memory array and components associated with the memory array; and
the plurality of decoding elements are distributed in a second pattern in the memory array such that each decoding element of the plurality of decoding elements is at a same position relative to at least one respective pillar of the plurality of pillars.

13. An apparatus, comprising:
a substrate extending in a first direction and a second direction; and
a memory array comprising:
a memory cell;
a pillar configured as a digit line and coupled with the memory cell, the pillar extending in a third direction different than the first direction and the second direction;
a word line coupled with the memory cell; and
a decoder coupled with the pillar and comprising a first stage and a second stage, the first stage of the decoder positioned in a first layer comprising one or more logic circuits associated with operating the memory array, the second stage of the decoder positioned in a second layer between the first layer and the memory array, the second stage of the decoder comprising:
a first vertical transistor coupled with a source node and the pillar; and
a second vertical transistor coupled with a ground node and the pillar.

14. The apparatus of claim 13, wherein:
the first vertical transistor comprises a first gate;
the second vertical transistor comprises a second gate; and
the first stage of the decoder is configured to bias the first gate of a first n-type transistor to a second voltage and the second gate of a second n-type transistor to a third voltage.

15. The apparatus of claim 14, wherein the source node is further configured to bias the pillar to a first voltage based at least in part on the first gate of the first n-type transistor being biased to the second voltage, and wherein the ground node is further configured to be isolated from the pillar based at least in part on the second gate of the second n-type transistor being biased to the third voltage.

16. The apparatus of claim 14, wherein the source node is further configured to isolate a first voltage from the pillar based at least in part on the first gate of the first n-type transistor being biased to the second voltage, and wherein the ground node is further configured to bias the pillar to a ground voltage based at least in part on the second gate of the second n-type transistor being biased to the third voltage.

17. The apparatus of claim 13, wherein:
the first vertical transistor is coupled with the source node via a first conductive line extending in the first direction;
the second vertical transistor is coupled with the ground node via a second conductive line extending in the first direction and parallel to the first conductive line; and
the first vertical transistor and the second vertical transistor are coupled with the pillar via a third conductive line extending the second direction.

18. The apparatus of claim 13, wherein the memory cell comprises:
a storage element formed of chalcogenide material coupled with the pillar and the word line.

19. The apparatus of claim 18, wherein:
the pillar is one of a plurality of pillars distributed in a first pattern in the memory array;
the decoder comprises a plurality of decoding elements that each comprise the first vertical transistor and the second vertical transistor; and
the plurality of decoding elements are distributed in a second pattern in the memory array such that each decoding element of the plurality of decoding elements is at a same position relative to at least one respective pillar of the plurality of pillars.

20. A method, comprising:
forming a layer comprising a first portion of a decoder associated with an array of memory cells, the layer and the array of memory cells extending in a first direction and a second direction;
depositing a first conductive line and a second conductive line extending in the first direction based at least in part on forming the layer;
depositing a first dielectric material over the first conductive line and the second conductive line;
forming a first opening in the first dielectric material that exposes the first conductive line and a second opening in the first dielectric material that exposes the second conductive line by etching a portion of the first dielectric material;
depositing, into the first opening, a first material to form a first junction in contact with the first conductive line;
depositing, into the second opening, a second material to form a second junction in contact with the second conductive line;
forming a first n-type transistor in contact with the first junction;
forming a second n-type transistor in contact with the second junction; and
forming the array of memory cells based at least in part on forming the first n-type transistor and forming the second n-type transistor.

* * * * *